(12) United States Patent
Mathuriya et al.

(10) Patent No.: US 11,699,699 B1
(45) Date of Patent: Jul. 11, 2023

(54) MULTI-FUNCTION THRESHOLD GATE WITH ADAPTIVE THRESHOLD AND STACKED PLANAR FERROELECTRIC CAPACITORS

(71) Applicant: Kepler Computing Inc., San Francisco, CA (US)

(72) Inventors: Amrita Mathuriya, Portland, OR (US); Rafael Rios, Austin, TX (US); Ikenna Odinaka, Durham, NC (US); Rajeev Kumar Dokania, Beaverton, OR (US); Debo Olaosebikan, San Francisco, CA (US); Sasikanth Manipatruni, Portland, OR (US)

(73) Assignee: Kepler Computing, Inc., San Francisco, CA (US)

( * ) Notice: Subject to any disclaimer, the term of this patent is extended or adjusted under 35 U.S.C. 154(b) by 0 days.

(21) Appl. No.: 17/552,107

(22) Filed: Dec. 15, 2021

Related U.S. Application Data

(63) Continuation of application No. 17/550,908, filed on Dec. 14, 2021.

(51) Int. Cl.
   *H01L 27/06* (2006.01)
   *H01L 23/528* (2006.01)
   *H01L 49/02* (2006.01)
(52) U.S. Cl.
   CPC ...... *H01L 27/0629* (2013.01); *H01L 23/5286* (2013.01); *H01L 28/60* (2013.01)
(58) Field of Classification Search
   None
   See application file for complete search history.

(56) References Cited

U.S. PATENT DOCUMENTS

| 3,260,863 A | 7/1966 | Burns et al. |
|---|---|---|
| 3,524,977 A | 8/1970 | Wang |

(Continued)

FOREIGN PATENT DOCUMENTS

| JP | 2000156472 A | 6/2000 |
|---|---|---|
| KR | 20160089141 A | 7/2016 |
| KR | 20170099862 A | 9/2017 |

OTHER PUBLICATIONS

Non-Final Office Action dated Jan. 24, 2022 for U.S. Appl. No. 17/327,648.
Non-Final Office Action dated Jan. 24, 2022 for U.S. Appl. No. 17/327,649.
Non-Final Office Action dated Jan. 24, 2022 for U.S. Appl. No. 17/327,659.

(Continued)

*Primary Examiner* — Jany Richardson
(74) *Attorney, Agent, or Firm* — Mughal Gaudry & Franklin PC

(57) ABSTRACT

An apparatus and configuring scheme where a ferroelectric capacitive input circuit can be programmed to perform different logic functions by adjusting the switching threshold of the ferroelectric capacitive input circuit. Digital inputs are received by respective capacitors on first terminals of those capacitors. The second terminals of the capacitors are connected to a summing node. A pull-up and pull-down device are coupled to the summing node. The pull-up and pull-down devices are controlled separately. During a reset phase, the pull-up and pull-down devices are turned on in a sequence, and inputs to the capacitors are set to condition the voltage on node n1. As such, a threshold for the capacitive input circuit is set. After the reset phase, an evaluation phase follows. In the evaluation phase, the output of the capacitive input circuit is determined based on the inputs and the logic function configured during the reset phase.

20 Claims, 17 Drawing Sheets

(56) References Cited

U.S. PATENT DOCUMENTS

| | | | |
|---|---|---|---|
| 5,381,352 | A | 1/1995 | Shou et al. |
| 5,818,380 | A | 10/1998 | Ito et al. |
| 5,835,045 | A | 11/1998 | Ogawa et al. |
| 5,926,057 | A | 7/1999 | Ogawa et al. |
| 5,978,827 | A | 11/1999 | Ichikawa |
| 6,043,675 | A | 3/2000 | Miyamoto |
| 6,166,583 | A | 12/2000 | Kochi et al. |
| 6,198,652 | B1 | 3/2001 | Kawakubo et al. |
| 6,208,282 | B1 | 3/2001 | Miyamoto |
| 7,837,110 | B1 | 11/2010 | Hess et al. |
| 7,897,454 | B2 | 3/2011 | Wang et al. |
| 8,247,855 | B2 | 8/2012 | Summerfelt |
| 9,276,040 | B1 | 3/2016 | Marshall et al. |
| 9,305,929 | B1 | 4/2016 | Karda et al. |
| 9,324,405 | B2 | 4/2016 | Evans, Jr. et al. |
| 9,697,882 | B1 | 7/2017 | Evans, Jr. et al. |
| 9,858,979 | B1 | 1/2018 | Derner et al. |
| 9,973,329 | B2 | 5/2018 | Hood et al. |
| 10,217,522 | B2 | 2/2019 | Wang et al. |
| 10,446,214 | B1 | 10/2019 | Vincenzo et al. |
| 10,679,782 | B2 | 6/2020 | Manipatruni et al. |
| 10,944,404 | B1 | 3/2021 | Manipatruni et al. |
| 10,951,213 | B1 | 3/2021 | Manipatruni et al. |
| 11,043,259 | B2 | 6/2021 | Wentzlaff et al. |
| 11,501,813 | B1 * | 11/2022 | Dokania ............... G11C 11/221 |
| 11,521,667 | B1 * | 12/2022 | Dokania ............. G11C 11/2275 |
| 2001/0052619 | A1 | 12/2001 | Inoue et al. |
| 2002/0163058 | A1 | 11/2002 | Chen et al. |
| 2004/0183508 | A1 | 9/2004 | Toyoda et al. |
| 2009/0058460 | A1 | 3/2009 | Kang |
| 2015/0337983 | A1 | 11/2015 | Dolenti et al. |
| 2017/0243917 | A1 | 8/2017 | Manipatruni et al. |
| 2017/0337983 | A1 | 11/2017 | Wang et al. |
| 2018/0025766 | A1 | 1/2018 | Dietrich et al. |
| 2018/0076815 | A1 | 3/2018 | Vigeant et al. |
| 2018/0240583 | A1 | 8/2018 | Manipatruni et al. |
| 2019/0074295 | A1 | 3/2019 | Schröder |
| 2019/0318775 | A1 | 10/2019 | Rakshit et al. |
| 2019/0348098 | A1 | 11/2019 | El-Mansour et al. |
| 2020/0091407 | A1 | 3/2020 | Liu et al. |
| 2020/0091414 | A1 | 3/2020 | Liu et al. |
| 2020/0210233 | A1 | 7/2020 | Chen et al. |

OTHER PUBLICATIONS

Notice of Allowance dated Jan. 12, 2021 for U.S. Appl. No. 17/327,614.
Notice of Allowance dated Jan. 28, 2022 for U.S. Appl. No. 17/327,651.
International Search Report & Written Opinion dated May 19, 2022 for PCT Patent Application No. PCT/US2022/070445.
Notice of Allowance dated Apr. 28, 2022 for U.S. Appl. No. 17/327,649.
Notice of Allowance dated Mar. 7, 2022 for U.S. Appl. No. 17/327,659.
Notice of Allowance dated Mar. 11, 2022 for U.S. Appl. No. 17/327,648.
"Kepler Logic", Named for Amalie Emmy Noether @ https://en.wikipedia.org/wiki/Emmy_Noether.
Fichtner, S. et al., "AlScN: A III-V semiconductor based ferroelectric", Journal of Applied Physics 125, 114103 (2019); https://doi.org/10.1063/1.5084945, 2019, 28 pages.
Final Office Action dated Dec. 9, 2021 for U.S. Appl. No. 17/327,614.
Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.
Muroga, S., "Threshold Logic and its Applications", New York, Wiley-Interscience. published 1971.
Non-Final Office Action dated Nov. 16, 2021 for U.S. Appl. No. 17/327,614.
Notice of Allowance dated Dec. 7, 2021 for U.S. Appl. No. 17/327,652.
Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.
Notice of Allowance notified May 15, 2023 for U.S. Appl. No. 17/327,662.
Notice of Allowance notified May 1, 2023 for U.S. Appl. No. 17/659,981.
Notice of Allowance notified May 1, 2023 for U.S. Appl. No. 17/659,992.

* cited by examiner

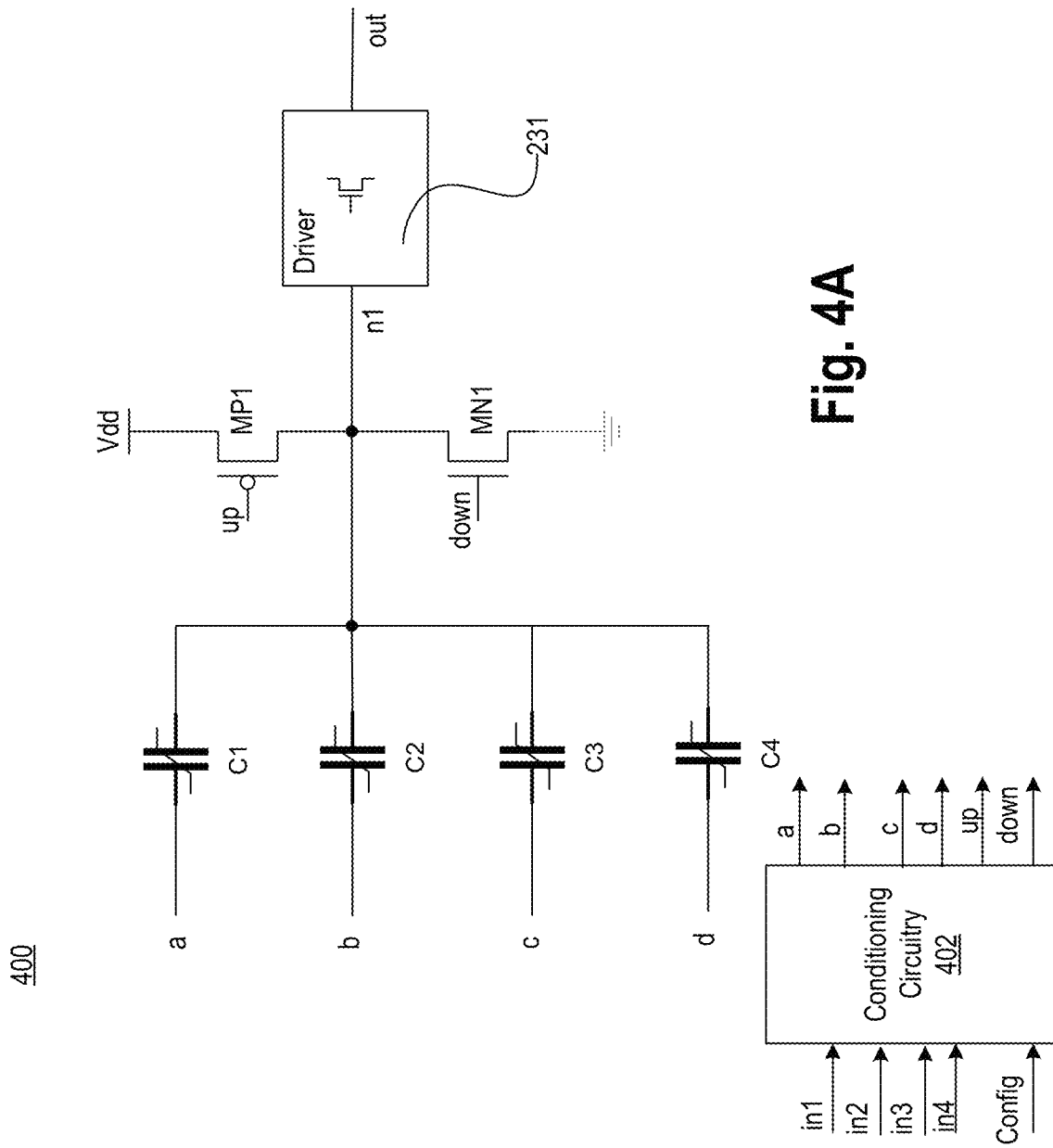

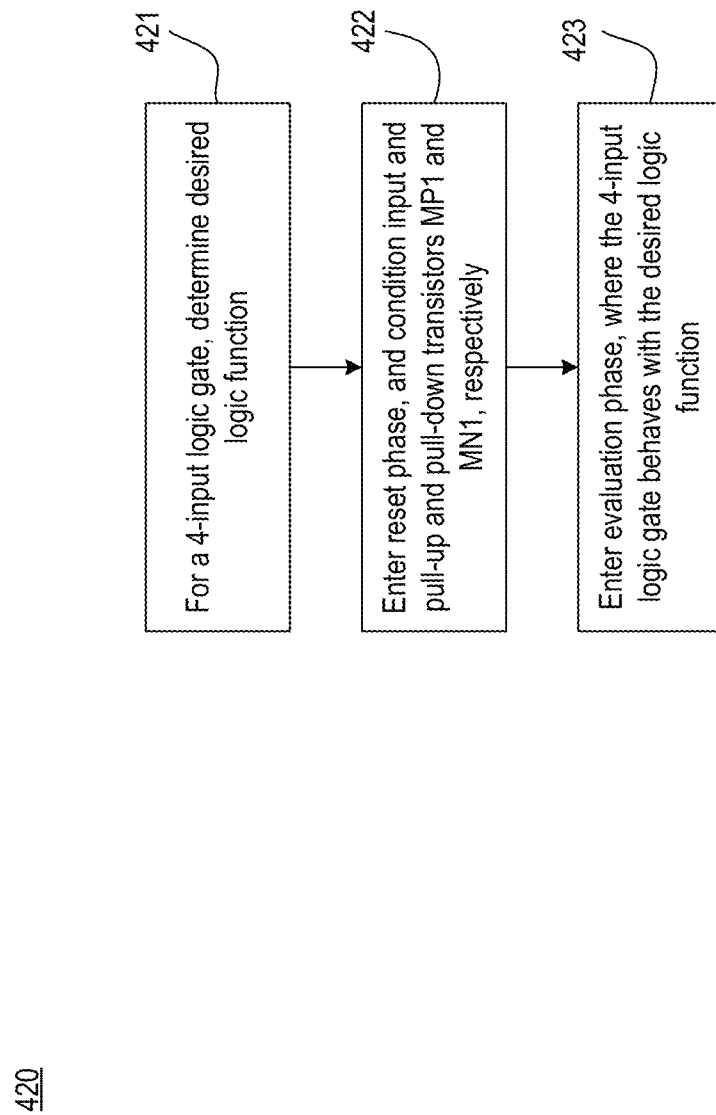

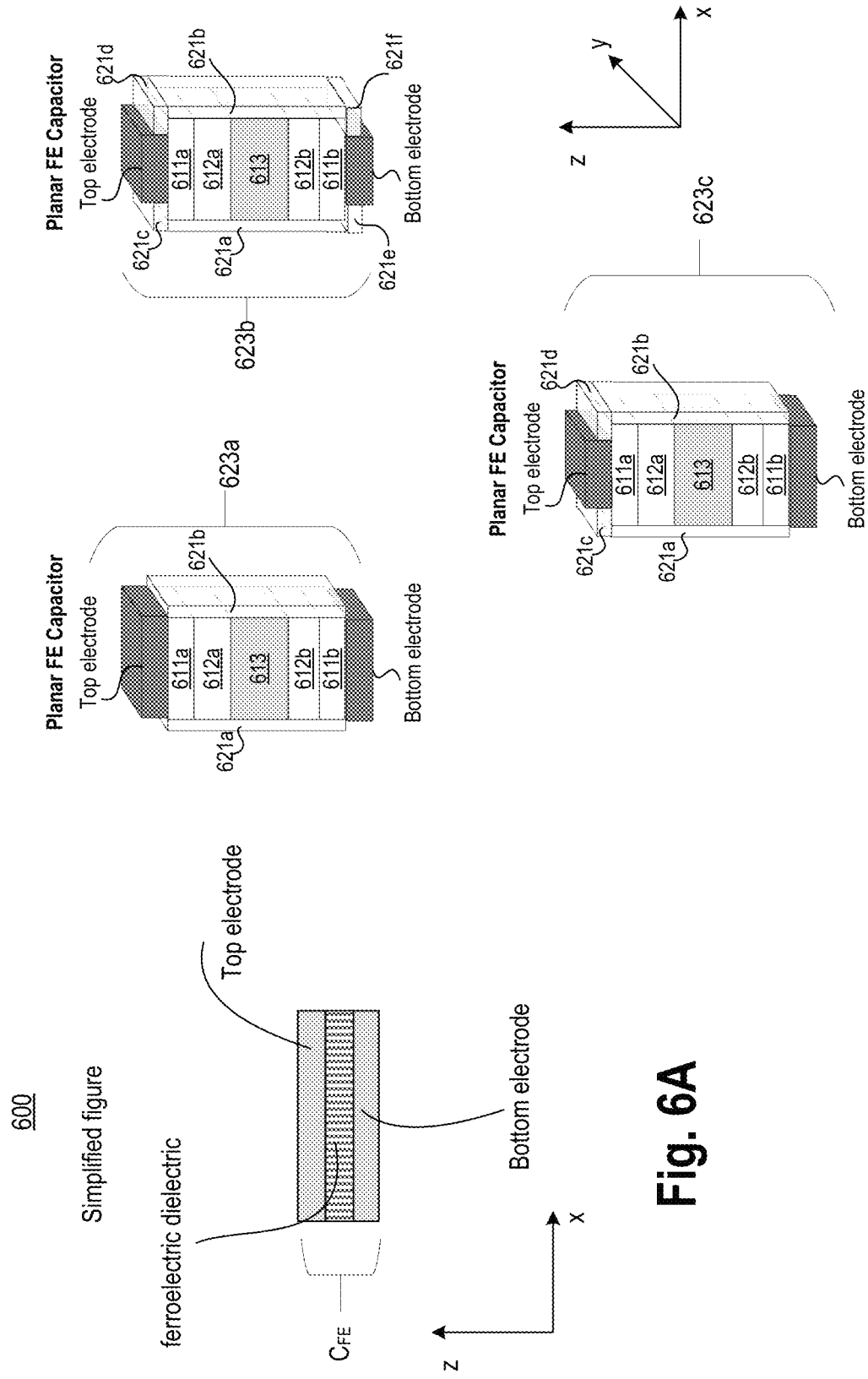

MULTI-FUNCTION THRESHOLD GATE WITH ADAPTIVE THRESHOLD AND STACKED PLANAR FERROELECTRIC CAPACITORS

CLAIM OF PRIORITY

This application is a continuation of, and claims benefit of priority of, U.S. application Ser. No. 17/550,908 titled "MULTI-FUNCTION FERROELECTRIC THRESHOLD GATE WITH INPUT BASED ADAPTIVE THRESHOLD," filed Dec. 14, 2021, which is incorporated by reference in its entirety.

BACKGROUND

Typical logic gates such as an AND gate, an OR gate, or a logic gate that receives three or more inputs may consist of nine more transistors per logic gate and many interconnects to connect the various transistors. As the number of transistors increases, power consumption also increases. As devices are pushing down the power envelope to save battery power, existing circuit architecture for multi-input logic gates present challenges to the goal of lower power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4A illustrates a 4-input capacitive circuit with configurable threshold and a general driver circuitry, wherein the 3-input capacitive circuit includes a pull-up device and the pull-down device, in accordance with some embodiments.

FIG. 4B illustrates a flowchart of a method to configure the 4-input capacitive circuit into a configurable threshold gate, in accordance with some embodiments.

FIG. 6A illustrates a planar capacitor structure, in accordance with some embodiments.

FIG. 6B illustrates three planar capacitor structures, respectively, in accordance with some embodiments.

DETAILED DESCRIPTION

Figure 1:
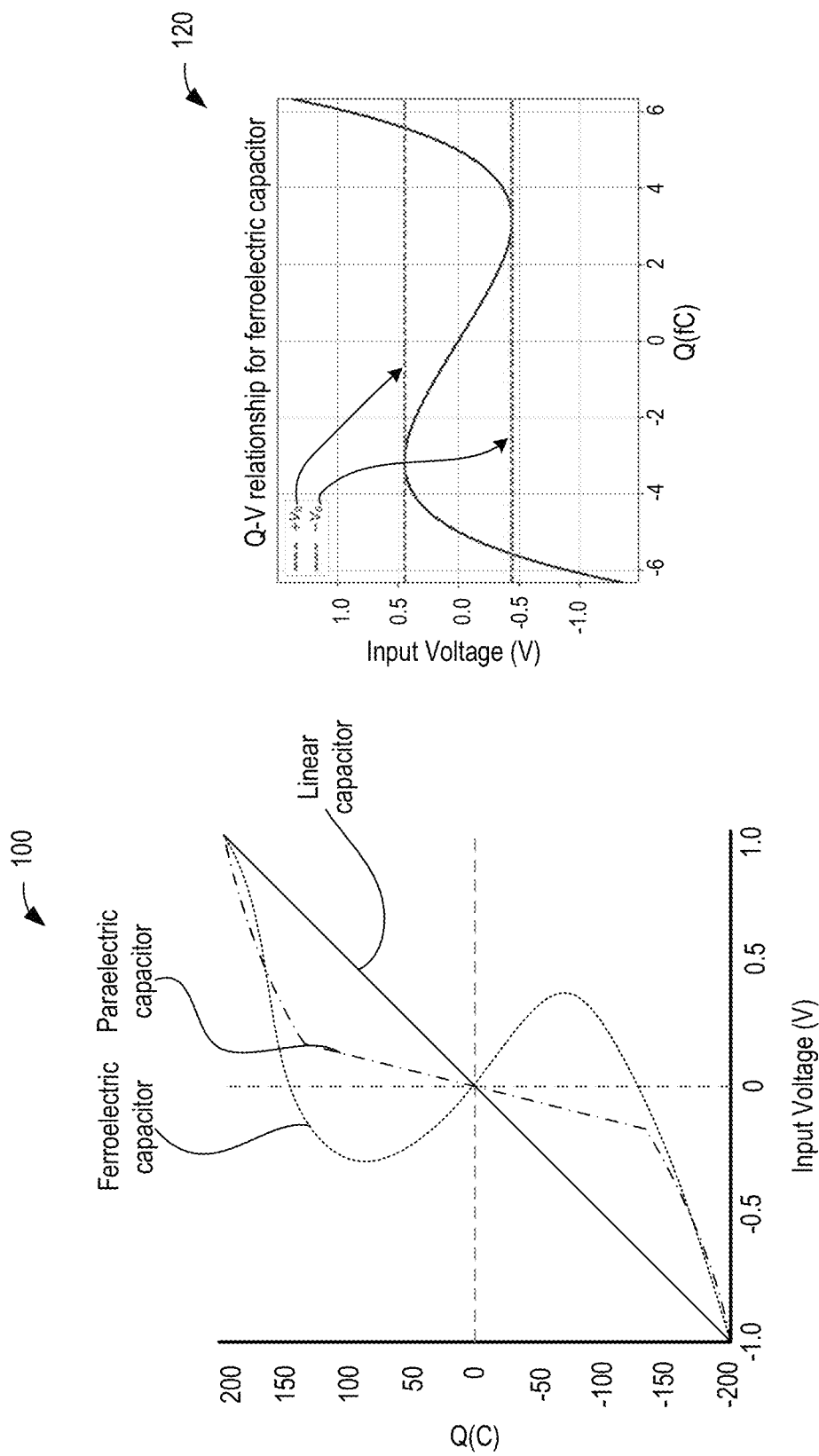
FIG. 1 illustrates a set of plots and showing behavior of a ferroelectric capacitor, a paraelectric capacitor, and a linear capacitor.

Some embodiments provide an apparatus and configuring scheme where capacitive input circuit can be programmed to perform different logic functions by adjusting the switching threshold of the capacitive input circuit. Digital inputs are received by respective capacitors on first terminals of those capacitors. In various embodiments, these capacitors comprise ferroelectric material. The second terminals of the capacitors are connected to a summing node, in accordance with various embodiments. In some embodiments, a pull-up and pull-down device is coupled to the summing node. The pull-up and pull-down devices are controlled separately.

In some embodiments, during a reset phase, the pull-up and pull-down devices are turned on or off in a sequence to condition the voltage on node n1. As such, a threshold for the capacitive input circuit is set. After the reset phase, an evaluation phase follows, in accordance with some embodiments. In the evaluation phase, the output of the capacitive input circuit is determined based on the inputs and the logic function configured during the reset phase, in accordance with various embodiments. For example, the capacitive input circuit may operate as a NAND/AND gate, NOR/OR gate, majority/minority, threshold gate, or other complex gates based on its threshold configuration. In various embodiments, during the evaluation phase, the pull-up and pull-down devices coupled to the summing node are turned off. In some embodiments, all input capacitors have the same capacitance (e.g., same weight or ratio). In some embodiments, the input capacitors may have different capacitance. In that case, the switching threshold for the input capacitor circuit is modified differently by the reset phase. In some embodiments, a different logic gate can be realized by sequencing turning on/off of the pull-up and pull-down devices, and changing inputs to the input capacitor circuit during the reset phase.

While the embodiments where are described with reference to up-to 5-input capacitive circuit using equal ratio for the capacitance, the same idea can be expanded to any number of input capacitive circuit with equal or unequal ratio for capacitances. In various embodiments, the capacitances are non-linear capacitors. For example, instead of linear dielectric, the capacitors include non-linear dielectric material. Examples of non-linear dielectric material include ferroelectric material and paraelectric material.

In some embodiments, the capacitor are planar capacitors. In some embodiments, the capacitors are pillar or trench capacitors. In some embodiments, the capacitors are vertically stacked capacitors to reduce the overall footprint of the multi-input capacitive circuit. In some embodiments, the transistors (MP1 and MN1) that charge or discharge the summing node n1 are planar or non-planar transistors. In some embodiments, transistors MP1 and MN1 are fabricated in the front-end of the die on a substrate. In some embodiments, one of the transistors (e.g., MP1 or MN1) is fabricated in the front-end of the die while another one of the transistors is fabricated in the backend of the end such that the stack of capacitors is between the frontend of the die and the backend of the die or between the two transistors. As such, the footprint of the multi-input capacitive circuit may be a footprint of a single transistor or slightly more than that.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots and showing behavior of a ferroelectric capacitor, a ferroelectric capacitor, and a linear capacitor. Plot 100 compares the transfer function for a linear capacitor, a ferroelectric (PE) capacitor (a non-linear capacitor) and a ferroelectric (FE) capacitor (a non-linear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100 \text{ nm})^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In some embodiments, the FE material is perovskite, which includes one or more of: La, Sr, Co, Sr, Ru, Y, Ba, Cu, Bi, Ca, and Ni. For example, metallic perovskites such as: (La,Sr)CoO3, SrRuO3, (La,Sr)MnO3, YBa2Cu3O7, Bi2Sr2CaCu2O8, LaNiO3, BaTiO3, KNbO3, NaTaO3, etc. may be used for FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rare earth substitution into the Bi site can tune the spontaneous distortion. In some embodiments, FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when FE material is a perovskite, the conductive oxides are of the type AA'BB'O3. A' is a dopant for atomic site A, it can be an element from the Lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In various embodiments, when metallic perovskite is used for FE material 313, conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05 or 0.5, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes Bismuth ferrite (BFO) with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, FE material includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, the FE material includes Hafnium oxides of the form, Hf1-x Ex Oy where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100.

Figure 2A:
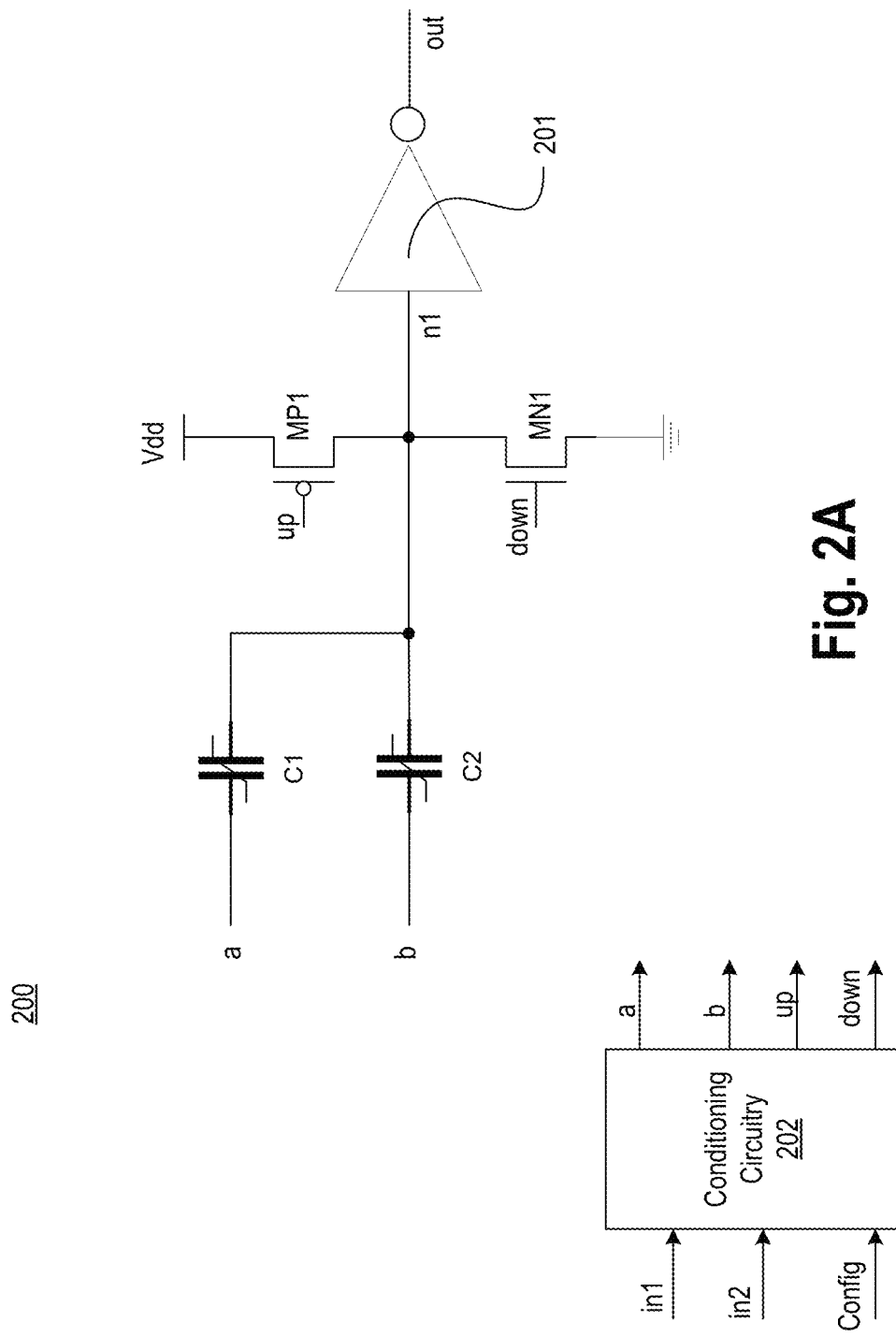
FIG. 2A illustrates a 2-input non-linear polar material based capacitive circuit with configurable threshold, in accordance with some embodiments.

FIG. 2A illustrates 2-input capacitive circuit 200 with configurable threshold, in accordance with some embodiments. In some embodiments, 2-input capacitive circuit 100 comprises a first input (a), a second input (b), summing node (n1), first capacitor C1, second capacitor C2, pull-up-device MP1, pull-down device MN1, driver 101, and output (out) coupled as shown. In some embodiments, the first capacitor C1 includes a first terminal coupled to the first input and a second terminal coupled to the summing node n1. In some embodiments, the second capacitor C2 includes a third terminal coupled to the second input and a fourth terminal coupled to the summing node n1. In some embodiments, the pull-up device MP1 is coupled to the summing node n1 and a power supply rail Vdd, wherein the pull-up device MP1 is controlled by a first control (up). In some embodiments, the pull-down device MN1 is coupled to the summing node n1 and a ground, wherein the pull-down device is controlled by a second control (down).

While the embodiment of FIG. 2A illustrates an inverter as driver 101, driver 201 can be any suitable logic. One such embodiment is illustrated by FIG. 2C. FIG. 2C illustrates a 2-input capacitive circuit 230 with configurable threshold and general driver 231 circuitry, in accordance with some embodiments. 2-input capacitive circuit 230 is like 2-input capacitive circuit 200, but with general driver 231. In some embodiments, general driver 231 is a non-inverting circuit such as a buffer, AND, OR, a capacitive input circuit, or any non-inverting circuit. In some embodiments, driver 231 is an inverting circuit such as an inverter, NAND, NOR, XOR, XNOR, or any inverting circuit etc. In some embodiments, driver 231 is a multiplexer that connects summing nodes of other capacitive circuits to its inputs. In some embodiments, one or more inputs of the multiplexer are driven from a transistor-based logic. As such, the multiplexer can selectively output a desired output. In some embodiments, driver 231 is another capacitive input circuit where one of the inputs is coupled to the summing node n1 and other input(s) are coupled to other inputs. As such, complex logic can be formed with configurable threshold and thus function(s).

Referring to FIG. 2A, in various embodiments, a conditioning circuitry 202 is provided which is used to control or condition the first input, the second input, the first control, and the second control during a reset phase to adjust a threshold of 2-input capacitive circuit 200. Conditioning circuitry 202 may receive inputs in1 and in2, and configuration setting (e.g., reset or evaluation) to determine the outputs 'a', 'b', up, and down. During the evaluation phase, in1 is passed on to output 'a' and in2 is passed on to 'b'. During the reset phase, depending on a desired threshold, outputs 'a' and 'b' are conditioned. In various embodiments, the pull-up device MP1 and pull-down device MN1 are turn on in a sequence during reset phase while inputs to the capacitors are kept constant for a particular threshold setting. In some embodiments, for different input values, the threshold can be configured differently. The sequence of turning on the pull-up device MP1 first and then the pull-down device MN1 can be reversed to readjust the threshold of the circuit. In various embodiments, the pull-up device MP1 and pull-down device MN1 are turned off after the reset phase is complete.

Here the term threshold generally refers to a number that indicates a number of inputs that should be set to logic high to perform a function of a threshold gate. For instance, by turning on/off one or more of the pull-up device MP1 and/or pull-down device MN1, and conditioning the inputs 'a' and 'b' during a reset phase, the charge at node n1 is set so that in an evaluation phase when the pull-up and pull-down devices (MP1 and MN1) are disabled, the input capacitive circuit attains a desired function.

In one instance, when the threshold is set to 2 in a reset phase by a particular sequencing of turning on/off the pull-up and/or the pull-down devices and conditioning of the inputs 'a' and 'b'; it means that during an evaluation phase when both inputs 'a' and 'b' are logic high, then voltage on node n1 is logic high. Continuing with this example, when any of the inputs 'a' and 'b' is a logic low, then the voltage on node n1 resolves to logic low. As such, 2-input capacitive circuit 200 is programmed or configured as a AND gate at node n1 and a NAND gate at output out.

Likewise, when the threshold is set to 1 in a reset phase by a particular sequencing of turning on/off the pull-up and the pull-down devices and conditioning of the inputs 'a' and 'b'; it means that during an evaluation phase when either input 'a' and 'b' is logic high, then voltage on node n1 is logic high. Continuing with this example, when both the inputs 'a' and 'b' is a logic low, then the voltage on node n1 resolves to logic low. As such, 2-input capacitive circuit 200 is programmed or configured as an OR gate at node n1 and a NOR gate at output out. So, the same circuit can be used as a AND/NAND or OR/NOR gate by conditioning the inputs and resetting or setting the voltage on the summing node during a reset phase. Subsequently, in the evaluation phase the circuit will behave as AND/NAND or OR/NOR gate.

In some embodiments, conditioning circuitry 202 turns off the pull-up device MP1 and the pull-down device MN1 during an evaluation phase separate from the reset phase. The reset phase or evaluation phase are indicated by the logic level of Config. For example, conditioning circuitry 202 sets the first control (up) to logic high (Vdd) and the second control (down) to logic low (ground) during an evaluation phase (e.g., Config is set to logic 1). Likewise, in a reset phase, Config is set to 0. This is just an example, and the logic level of Config can be modified to present the evaluation phase and the reset phase.

In some embodiments, conditioning circuitry 202 sets the threshold to 0 in a reset phase by first enabling or turning on the pull-down device MN1, and then turning on or enabling the pull-up device MP1, and providing logic 0 to the first input and the second input. A threshold of 0 means that the capacitive input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 202 sets the threshold to 1 in a reset phase by first enabling or turning on the pull-down device MN1, and then turning on the pull-up device MP1, and providing logic 1 to the first input 'a' and logic 0 to the second input 'b'. In some embodiments, conditioning circuitry 202 sets the threshold to 1 in a reset phase by first enabling or turning on the pull-up device MP1, and then turning on or enabling the pull-down device MN1, and providing logic 0 to the first input 'a' and to the second input 'b'.

In some embodiments, conditioning circuitry 202 sets the threshold to 2 in a reset phase by first enabling or turning on the pull-up device MP1, and then turning on the pull-down device MN1, and providing logic 1 to the first input 'a' and logic 0 the second input 'b'. In some embodiments, conditioning circuitry 202 sets the threshold to 2 in a reset phase by first enabling or turning on the pull-down device MN1, and then turning on the pull-up device MP1, and providing logic 1 (e.g., Vdd) to the first input 'a' and to the second input 'b'.

In some embodiments, conditioning circuitry 202 sets the threshold to 3 in a reset phase by first enabling or turning on the pull-up device MP1, and then turning on or enabling the pull-down device MN1, and providing logic 1 to the first input and the second input. A threshold of 3 for a 2-input capacitive circuit means that capacitive input circuit is an always off circuit regardless of the logic levels of inputs. In one such embodiment, during the evaluation phase for the circuit configured with threshold of n+1 (e.g., 3, where 'n' is the number of capacitive inputs), the logic value on node n1 is floating or drifting and the charge on that node may eventually discharge to ground. In some cases, the voltage on node n1 may charge to supply level via the pull-up device when the node n1 is floating. For example, initially the voltage on the floating node discharges to zero voltages, but then it may charge up via leakage to the supply voltage over time. In some embodiments, when the threshold is n+1, the capacitive input circuit may not turn on even when the inputs to the capacitors are changing. In some embodiments, the voltage on node n1 is zero volts regarding of input setting when the threshold in n+1.

Figure 2B:
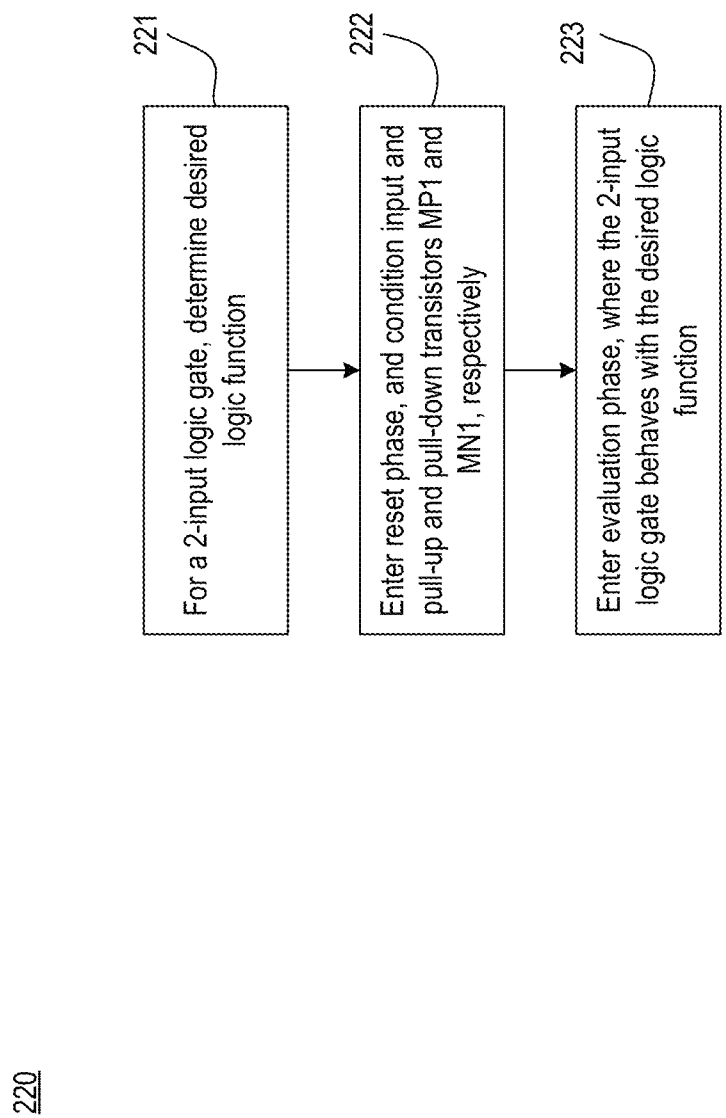
FIG. 2B illustrates a flowchart of a method to configure the 2-input capacitive circuit into a configurable threshold gate, in accordance with some embodiments.
Figure 2C:
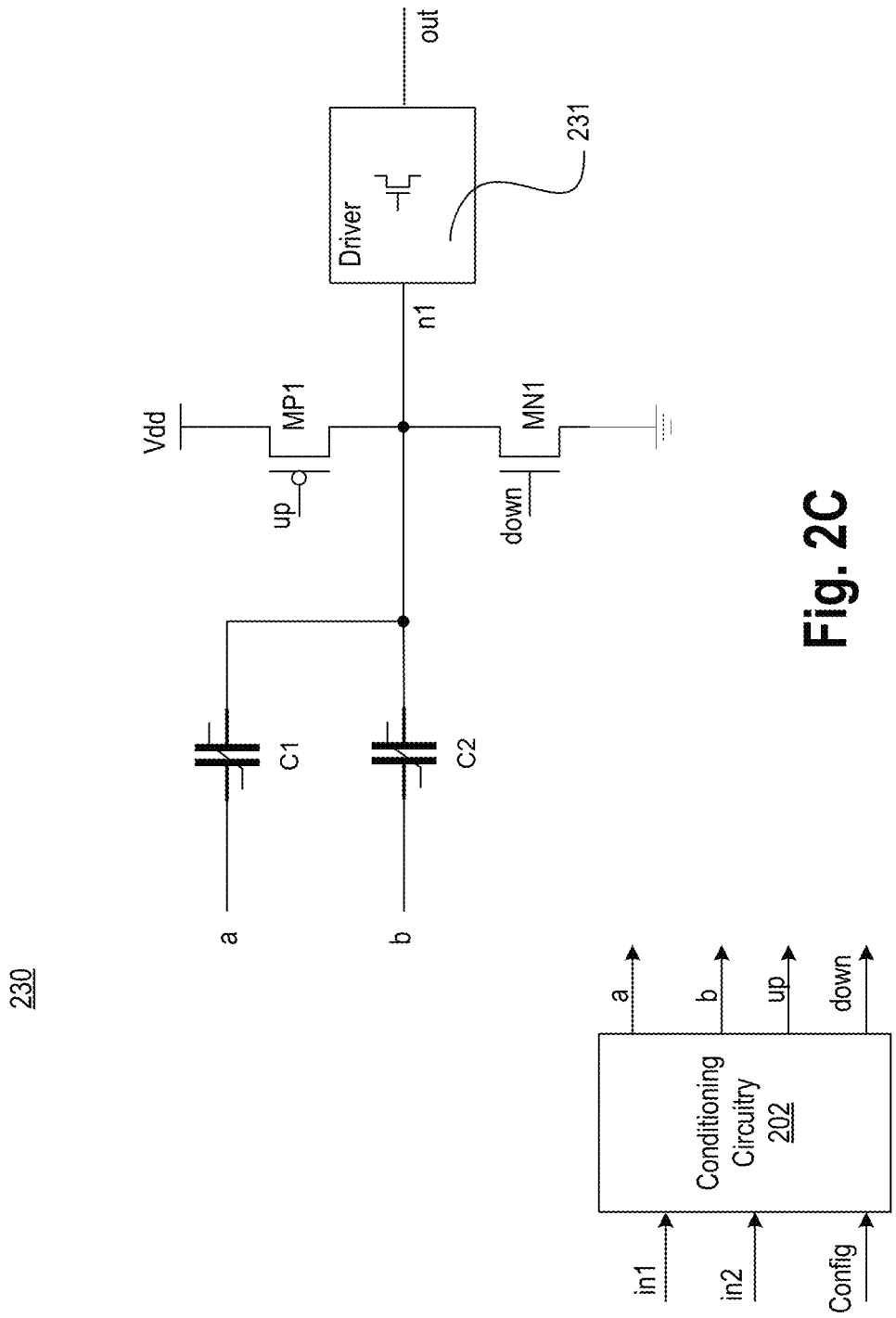
FIG. 2C illustrates a 2-input capacitive circuit with configurable threshold and a general driver circuitry, in accordance with some embodiments.

FIG. 2B illustrates flowchart 220 of a method to configure the 2-input capacitive circuit into a configurable threshold gate, in accordance with some embodiments. The blocks of the flowchart can be controlled by hardware, software, or a combination of them. At block 221, a decision is made about the kind of logic function to configure 2-input capacitive circuit 200. For example, a control logic block or a conditioning circuit 202 may determine whether 2-input capacitive circuit 200 is to behave as a AND/NAND gate, an OR/NOR gate, an always-on circuit, or a disconnected circuit.

At block 222, control logic block or a conditioning circuit 202 places 2-input capacitive circuit 200 in a reset phase. In the reset phase, the inputs 'a' and 'b' and controls for the pull-up device MP1 and pull-down device MN1 are set or conditioned to configure or adjust the threshold for the 2-input capacitive circuit. In some embodiments, control logic block or a conditioning circuit 202 may adjust a threshold of 2-input capacitive circuit 200 to configure the 2-input capacitive circuit 200 as a particular logic function. When the input capacitors are ferroelectric capacitors (because they include ferroelectric material for their dielectric), control logic block or a conditioning circuit 202 sequencies the turning on of the pull-up device MP1 and the pull-down device MN1 to achieve a particular threshold for a given set of inputs to the capacitors. In some embodiments, the pull-up device MP1 is turned on before the pull-down device MN1. In some embodiments, the pull-down device MN1 is turned on before the pull-up device MP1.

Table 1 illustrates an example of input conditioning to set various thresholds during a reset phase for 2-input capacitive circuit 200. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 1

| Input 'a' | Input 'a' | Time T1 | Time T2 | Time T3 | Threshold |
|---|---|---|---|---|---|
| 0 | 0 | 1 (enable MN1) | 0 (disable MN1) | 0 (enable MP1) | 0 |
| 1 | 0 | 1 (enable MN1) | 0 (disable MN1) | 0 (enable MP1) | 1 |
| 1 | 1 | 1 (enable MN1) | 0 (disable MN1)) | 0 (enable MP1) | 2 |
| 0 | 0 | 0 (enable MP1) | 1 (disable MP1) | 1 (enable MN1) | 1 |
| 1 | 0 | 0 (enable MP1) | 1 (disable MP1) | 1 (enable MN1) | 2 |
| 1 | 1 | 0 (enable MP1) | 1 (disable MP1) | 1 (enable MN1) | 3 |

While the embodiments are illustrated with reference to same capacitances for first capacitor C1 and the second capacitor C2, the threshold can be affected by changing the capacitive ratio of C1 and C2. For example, the input conditioning scheme and the pull-up and pull-down device control can result in a different threshold than that in Table 1 when the capacitive ratio of C1 and C2 is not 1:1. Overall, the configuring scheme of various embodiments herein provide the flexibility of programming the threshold for 2-input capacitive circuit 200 in a reset phase to achieve a certain logic function in the evaluation phase.

At block 223, control logic block or a conditioning circuit 202 releases the reset phase and allows the 2-input capacitive circuit to evaluate the inputs in the evaluation phase. Table 2 illustrates a logic function achieved in the evaluation phase by configuring or adjusting the threshold in the reset phase for 2-input capacitive circuit 200. In various embodiments, the pull-up device MP1 and the pull-down device MN1 are disabled during the evaluation phase.

TABLE 2

| Threshold | Logic Function on node n1 | Logic function on node "out" |
|---|---|---|
| 3 | Logic 0 | Logic 1 |
| 2 | AND | NAND |
| 1 | OR | NOR |
| 0 | Logic 1 | Logic 0 |

In some embodiments, a 1-input capacitive circuit is provided which comprises an input (e.g., input 'a') coupled to capacitor C1 on one terminal, while the other terminal of capacitor C1 is coupled to node n1. No additional inputs or capacitors are coupled to node n1 in one such embodiment. In some embodiments, pull-up and pull-down devices MP1 and MN1 are coupled to node n1 such as in 2-input capacitive circuit 200. In some embodiments, pull-up device MP1 is coupled to node n1 such as in 2-input capacitive circuit 240. In some embodiments, pull-down device MN1 is coupled to node n1 such as in 2-input capacitive circuit 250. In some embodiments, the 1-input capacitive circuit can be configured to thresholds of 0, 1, or 2 during a reset phase.

Table 3 illustrates the threshold adjustment or programmed value for different input settings of input 'a' and on/off condition for pull-up and pull-down devices (MP1 and MN1). Here, the time events T1, T2, and T2 may be separated by a few Gigahertz depending on the material used for the ferroelectric capacitors and the leakage effects on node n1. Event T1 occurs first, then T2, and then T3.

TABLE 3

| 'a' | Time event T1 | Timing event T2 | Time event T3 | Threshold |
|---|---|---|---|---|
| 0 | 1 (enable MN1) | 0 (disable MN1) | 0 (enable MP1) | 0 |
| 1 | 1 (enable MN1) | 0 (disable MN1) | 0 (enable MP1) | 1 |
| 0 | 0 (enable MP1) | 1 (disable MP1) | 1 (enable MN1) | 1 |
| 1 | 0 (enable MP1) | 1 (disable MP1) | 1 (enable MN1) | 2 |

In some embodiments, a conditioning circuitry sets the threshold to 0 for the 1-input capacitive circuit by first enabling or turning on the pull-down device MN1 at time event T1, then disabling or turning off the pull-down device MN1 at time event T2, and then enabling or turning on the pull-up device MP1 at time event T3 and providing input 0 to input 'a'. In some embodiments, in the evaluation phase, if the threshold is 0 for the 1-input capacitive circuit, then logic value of node n1 is 1 regardless of the input logic level at the input terminal of capacitor C1 (e.g., the terminal that is not connected to node n1 of this circuit).

In some embodiments, a conditioning circuitry sets the threshold to 1 for the 1-input capacitive circuit by first enabling or turning on the pull-down device MN1 at time event T1, then disabling or turning off the pull-down device MN1 at time event T2, and then enabling or turning on the pull-up device MP1 at time event T3 and providing input 1 to input 'a'. In some embodiments, a conditioning circuitry sets the threshold to 1 for the 1-input capacitive circuit by first enabling or turning on the pull-up device MP1 at time event T1, then disabling or turning off the pull-up device MP1 at time event T2, and then enabling or turning on the pull-down device MN1 at time event T3 and providing input 0 to input 'a'. In some embodiments, in the evaluation phase, if the threshold is 1 for the 1-input capacitive circuit, then the 1-input capacitive circuit behaves as a buffer (or an always on pass-gate). As such, the logic value on node n1 is the same as the logic value at the input terminal of capacitor C1 (e.g., the terminal that is not connected to node n1 of this circuit).

In some embodiments, a conditioning circuitry sets the threshold to 2 for the 1-input capacitive circuit by first enabling or turning on the pull-up device MP1 at time event T1, then disabling or turning off the pull-up device MP1 at time event T2, and then enabling or turning on the pull-down device MN1 at time event T3 and providing input 1 to input 'a'. In some embodiments, in the evaluation phase, if the threshold is 2 for the 1-input capacitive circuit, then logic value of node n1 is 0 regardless of the input logic level at the input terminal of capacitor C1 (e.g., the terminal that is not connected to node n1 of this circuit). In some embodiments, during the evaluation phase for the circuit configured with threshold of n+1 (e.g., 2, where 'n' is the number of capacitive inputs), the logic value on node n1 is floating and may eventually discharge to ground or charge to supply level. In some embodiments, the voltage on node n1 is zero volts regarding of input setting when the threshold in 2 (e.g., n+1).

Table 4 summarizes the logic function for a 1-input capacitive circuit after its threshold is programmed. Here, the logic at the output "out" assumes an inverter as a driver connected to node n1.

TABLE 4

| Threshold | Logic Function on node n1 | Logic function on node "out" |
|---|---|---|
| 0 | Logic 1 | Logic 0 |
| 1 | Buffer | inverter |
| 2 | Logic 0 | Logic 1 |

Figure 3A:
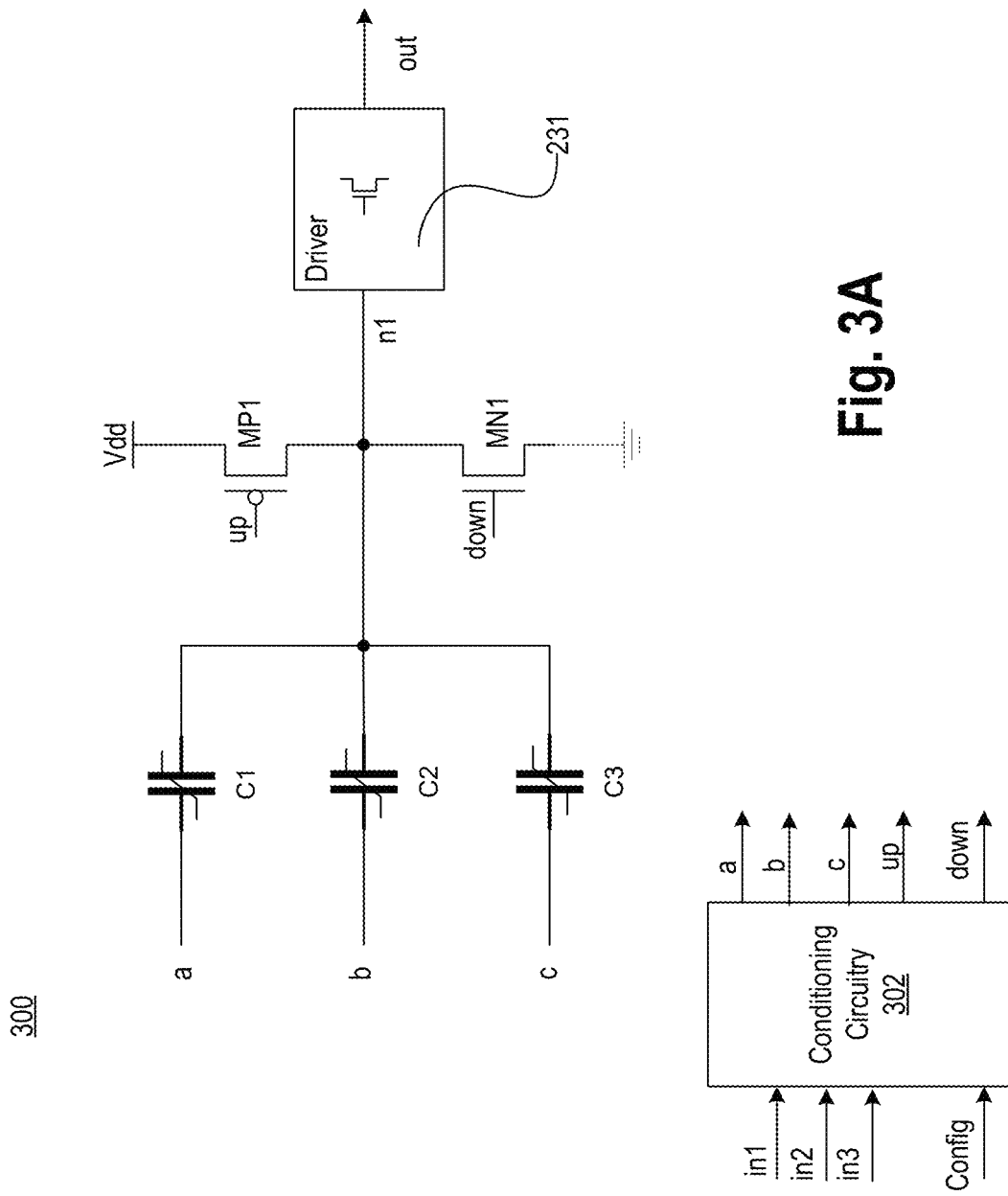
FIG. 3A illustrates a 3-input capacitive circuit with configurable threshold and a general driver circuitry, wherein the 3-input capacitive circuit includes a pull-up device and the pull-down device, in accordance with some embodiments.

FIG. 3A illustrates 3-input capacitive circuit 300 with configurable threshold, in accordance with some embodiments. 3-input capacitive circuit 300 is like 2-input capacitive circuit 200 but for additional input 'c' and associated capacitor C3. In some embodiments, a first terminal of capacitor C3 is coupled to input 'c' while a second terminal of capacitor C3 is coupled to summing node n1. Conditioning circuit 202 is replaced with a conditioning circuit 302. Conditioning circuitry 302 may receive inputs in1, in2, and in3 and configuration setting (e.g., reset or evaluation) to determine the outputs 'a', 'b', 'c', up, and down. During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off the pull-up device MP1 and pull-down device MN1 in a sequence, and conditioning the inputs 'a', 'b', and 'c' during a reset phase, the charge at node n1 is set. As such, in an evaluation phase when the pull-up and the pull-down devices (MP1 and MN1) are disabled, 3-input capacitive circuit 300 attains a desired function.

In some embodiments, conditioning circuitry 302 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c'. A threshold of 0 means that the capacitive input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 302 sets the threshold to 1 in a reset phase by first enabling or turning on the pull-down device MN1, and then turning on or enabling the pull-up device MP1, and providing logic 1 to the first input 'a', logic 0 to the second input 'b', and logic 0 to the third input 'c'. In some embodiments, conditioning circuitry 302 sets the threshold to 1 in a reset phase by first enabling or turning on the pull-up device MP1, and then turning on or enabling the pull-down device MN1, and providing logic 0 to the first input 'a', logic 0 to the second input 'b', and logic 0 to the third input 'c'. In some embodiments, when the threshold is set to 1 in a reset phase by a particular sequencing of turning on/off the pull-up and the pull-down devices and conditioning of the inputs 'a', 'b', and 'c'; it means that during an evaluation phase when any of the inputs 'a' 'b' or 'c' is logic high, then voltage on node n1 is logic high. Continuing with this example, in the evaluation phase when all inputs 'a', 'b', or 'c' are a logic low, then the voltage on node n1 resolves to logic low. As such, 3-input capacitive circuit 300 is programmed or configured as an OR gate at node n1 and a NOR gate at output out (assuming the driver circuitry is an inverter).

In some embodiments, conditioning circuitry 302 sets the threshold to 2 in a reset phase by first enabling or turning on the pull-down device MN1, and then turning on or enabling the pull-up device MP1, and providing logic 1 to the first input 'a', logic 1 to the second input 'b', and logic 0 to the third input 'c'. In some embodiments, conditioning circuitry 302 sets the threshold to 2 in a reset phase by first enabling or turning on the pull-up device MP1, and then turning on or enabling the pull-down device MN1, and providing logic 1 to the first input 'a', logic 0 to the second input 'b', and logic 0 to the third input 'c'. In some embodiments, when the threshold is set to 2 in a reset phase by a particular sequencing of turning on/off the pull-up and the pull-down devices and conditioning of the inputs 'a', 'b', and 'c'; it means that during an evaluation phase when at least two of the three inputs 'a', 'b', and 'c' are logic high, then voltage on node n1 is logic high. Continuing with this example, when at least two inputs of the three inputs 'a' 'b' and 'c' is a logic low, then the voltage on node n1 resolves to logic low. As such, 3-input capacitive circuit 300 is programmed or configured as a majority gate at node n1 and a minority gate at output out (when the driver circuitry is an inverter). In some cases, depending upon the leakage balance of pull-up transistor MP1 and pull-down MN1 as it impacts charge on the summing node n1, 3-input capacitive circuit 300 may lose its majority logic functionality over time. This loss in functionality of the majority function can be restored by resetting the summing node n1 via transistors MP1 and MN1, in accordance with some embodiments.

In some embodiments, conditioning circuitry 302 sets the threshold to 3 in a reset phase by first enabling or turning on the pull-down device MN1, and then turning on or enabling the pull-up device MP1, and providing logic 1 to the first input 'a', logic 1 to the second input 'b', and logic 1 to the third input 'c'. In some embodiments, conditioning circuitry 302 sets the threshold to 3 in a reset phase by first enabling or turning on the pull-up device MP1, and then turning on or enabling the pull-down device MN1, and providing logic 1 to the first input 'a', logic 1 to the second input 'b', and logic 0 to the third input 'c'. In some embodiments, when the threshold is set to 3 in a reset phase by a particular sequencing of turning on/off the pull-up and the pull-down devices and conditioning of the inputs 'a', 'b', and 'c'; it means that during an evaluation phase when all three inputs 'a', 'b', and 'c' are logic high, then voltage on node n1 is logic high. Continuing with this example, when any of the three inputs 'a' 'b', and 'c' is a logic low, then the voltage on node n1 resolves to logic low. As such, 3-input capacitive circuit 300 is programmed or configured as a 3-input AND at node n1 and a 3-input NAND gate at output out (assuming the driver circuitry is an inverter).

In some embodiments, conditioning circuitry 302 sets the threshold to 4 in a reset phase by first enabling or turning on the pull-up device MP1, and then turning on or enabling the pull-down device MN1, and providing logic 1 to the first input 'a', the second input 'b', and the third input 'c'. A threshold of 4 for a 3-input capacitive circuit means that capacitive input circuit is an always off circuit regardless of the logic levels of the inputs. In one such embodiment, during the evaluation phase for the circuit configured with threshold of n+1 (e.g., 4, where 'n' is the number of capacitive inputs), the logic value on node n1 is floating and may eventually discharge to ground or charge to supply level. In some embodiments, the voltage on node n1 is zero volts regarding of input setting when the threshold in 4 (e.g., n+1).

So, the same circuit can be used as a majority/minority gate, AND/NAND, OR/NOR, always-on gate, or a disconnected gate by conditioning the inputs and resetting or setting the voltage on the summing node during a reset phase. Subsequently, in the evaluation phase the circuit will behave as a 3-input majority/minority, 3-input AND/NAND, 3-input OR/NOR gate, a 3-input always-on gate, or a 3-input disconnected gate.

Figure 3B:
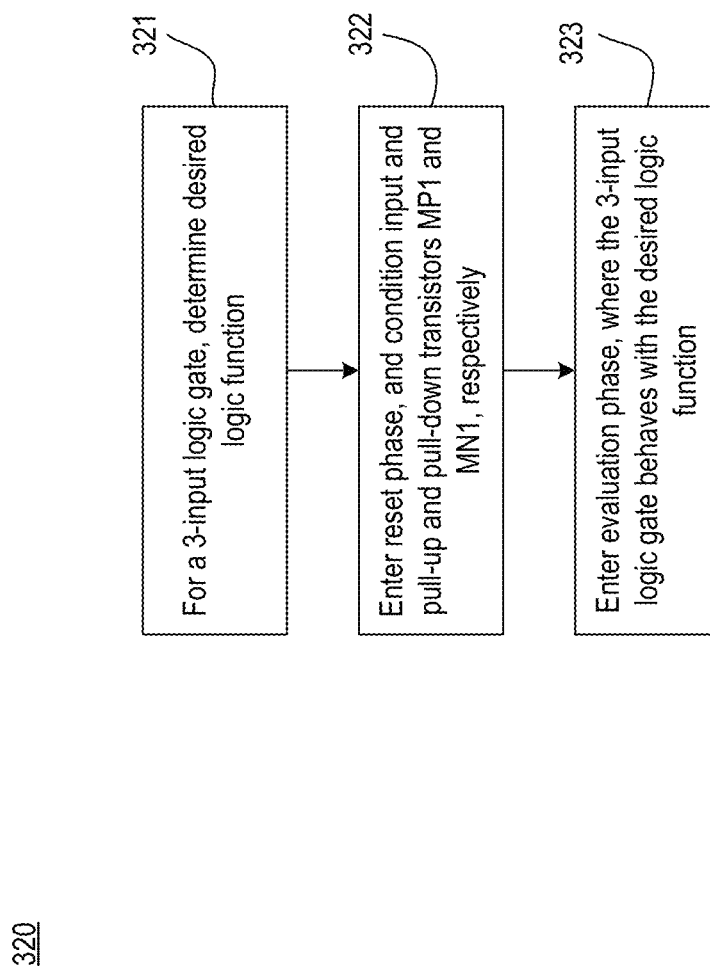
FIG. 3B illustrates a flowchart of a method to configure the 3-input capacitive circuit into a configurable threshold gate, in accordance with some embodiments.

FIG. 3B illustrates flowchart 320 of a method to configure the 3-input capacitive circuit into a configurable threshold gate, in accordance with some embodiments. The blocks of flowchart 320 can be controlled by hardware, software, or a combination of them. At block 321, a decision is made about the kind of logic function to configure 3-input capacitive circuit 300. For example, a control logic block or a conditioning circuit 302 may determine whether 3-input capacitive circuit 300 is to behave as an always-on circuit, always disconnected circuit, a majority/minority, an AND/NAND gate or an OR/NOR gate. In some embodiments, control logic block or a conditioning circuit 302 may adjust a threshold of 3-input capacitive circuit 300 to configure the 3-input capacitive circuit 300 as a particular logic function.

At block 322, control logic block or a conditioning circuit 302 places 3-input capacitive circuit 300 in a reset phase. In the reset phase, the inputs 'a', 'b', and 'c' and controls for the pull-up device MP1 and pull-down device MN1 are set or conditioned to configure or adjust the threshold for the 3-input capacitive circuit. In some embodiments, control logic block or a conditioning circuit 302 may adjust a threshold of 3-input capacitive circuit 300 to configure the 3-input capacitive circuit 300 as a particular logic function. When the input capacitors are ferroelectric capacitors (because they include ferroelectric material for their dielectric), control logic block or a conditioning circuit 302 sequences the turning on of the pull-up device MP1 and the pull-down device MN1 to achieve a particular threshold for a given set of inputs to the capacitors. In some embodiments, the pull-up device MP1 is turned on before the pull-down device MN1. In some embodiments, the pull-down device MN1 is turned on before the pull-up device MP1.

Table 5 illustrates an example of input conditioning to set various thresholds during a reset phase for 3-input capacitive circuit 300. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 5

| 'a' | 'b' | 'c' | T1 | T2 | T3 | Threshold |
|---|---|---|---|---|---|---|
| 0 | 0 | 0 | 1 (enable MN1) | 0 (disable MN1) | 0 (enable MP1) | 0 |
| 1 | 0 | 0 | 1 (enable MN1) | 0 (disable MN1) | 0 (enable MP1) | 1 |
| 1 | 1 | 0 | 1 (enable MN1) | 0 (disable MN1) | 0 (enable MP1) | 2 |
| 1 | 1 | 1 | 1 (enable MN1) | 0 (disable MN1) | 0 (enable MP1) | 3 |
| 0 | 0 | 0 | 0 (enable MP1) | 1 (disable MP1) | 1 (enable MN1) | 1 |
| 1 | 0 | 0 | 0 (enable MP1) | 1 (disable MP1) | 1 (enable MN1) | 2 |
| 1 | 1 | 0 | 0 (enable MP1) | 1 (disable MP1) | 1 (enable MN1) | 3 |
| 1 | 1 | 1 | 0 (enable MP1) | 1 (disable MP1) | 1 (enable MN1) | 4 |

While the embodiments are illustrated with reference to same capacitances for the first capacitor C1, the second capacitor C2, and the third capacitor C3, the threshold can be affected by changing the capacitive ratio of C1, C2, and C3 relative to one another. For example, the input conditioning scheme and the pull-up and pull-down device control can result in a different threshold than that in Table 5 when the capacitive ratio of C1, C2, and C3 is not 1:1:1. Overall, the configuring scheme of various embodiments herein provide the flexibility of programming or adjusting the threshold for 3-input capacitive circuit 300 in a reset phase to achieve a certain logic function in the evaluation phase.

At block 323, control logic block or a conditioning circuit 302 releases the reset phase and allows 3-input capacitive circuit to evaluate the inputs in the evaluation phase. Table 6 illustrates a logic function achieved in the evaluation phase by configuring the threshold in the reset phase for 3-input capacitive circuit 300. In various embodiments, the pull-up device MP1 and the pull-down device MN1 are disabled during the evaluation phase.

TABLE 6

| Threshold | Logic Function on node n1 | Logic function on node "out" |
|---|---|---|
| 0 | Logic 1 | Logic 0 |
| 1 | OR | NOR |
| 2 | Majority | Minority |
| 3 | AND | NAND |
| 4 | Logic 0 | Logic 1 |

FIG. 4A illustrates 4-input capacitive circuit 400 with configurable threshold, in accordance with some embodiments. 4-input capacitive circuit 400 is like 3-input capacitive circuit 300 but for additional input 'd' and associated capacitor C4. In some embodiments, a first terminal of capacitor C4 is coupled to input 'd' while a second terminal of capacitor C4 is coupled to summing node n1. Conditioning circuit 302 is replaced with a conditioning circuit 402. Conditioning circuitry 402 may receive inputs in1, in2, in3, and in4 and configuration setting (e.g., reset or evaluation) to determine the outputs 'a', 'b', 'c', 'd', up, and down. During the evaluation phase, in1 is passed on to output 'a', in2 is passed on to 'b', in3 is passed on to 'c', and in4 is passed on to 'd'. During the reset phase, depending on a desired threshold, outputs 'a', 'b', 'c' and 'd' are conditioned.

In some embodiments, by turning on/off the pull-up device MP1 and pull-down device MN1 in a sequence, and conditioning the inputs 'a', 'b', 'c', and 'd' during a reset phase, the charge at node n1 is set or adjusted. As such, in an evaluation phase when the pull-up and pull-down devices (MP1 and MN1) are disabled, 4-input capacitive circuit 400 attains a desired function.

In some embodiments, conditioning circuitry 402 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c' and input 'd'. A threshold of 0 means that conditioning circuitry 402 is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 402 sets the threshold to 1 in a reset phase by first enabling or turning on the pull-down device MN1, and then turning on or enabling the pull-up device MP1, and providing logic 1 to the first input 'a', logic 0 to the second input 'b', logic 0 to the third input 'c', and logic 0 to fourth input 'd'. In some embodiments, conditioning circuitry 402 sets the threshold to 1 in a reset phase by first enabling or turning on the pull-up device MP1, and then turning on or enabling the pull-down device MN1, and providing logic 0 to the first input 'a', logic 0 to the second input 'b', logic 0 to the third input 'c', and logic 0 to the fourth input 'd'. In some embodiments, when the threshold is set to 1 in a reset phase by a particular sequencing of turning on/off the pull-up and the pull-down devices and conditioning of the inputs 'a' 'b' 'c', and 'd'; it means that during an evaluation phase when any of the inputs 'a' 'b', 'c' or 'd' is logic high, then voltage on node n1 is logic high. Continuing with this example, in the evaluation phase when all inputs 'a', 'b', 'c', or 'd' are a logic low, then the voltage on node n1 resolves to logic low. As such, 4-input capacitive circuit 400 is programmed or configured as an OR gate at node n1 and a NOR gate at output out (assuming the driver circuitry is an inverter).

In some embodiments, conditioning circuitry 402 sets the threshold to 2 in a reset phase by first enabling or turning on the pull-down device MN1, and then turning on or enabling the pull-up device MP1, and providing logic 1 to the first input 'a', logic 1 to the second input 'b', logic 0 to the third input 'c', and logic 0 to fourth input 'd'. In some embodiments, conditioning circuitry 402 sets the threshold to 2 in a reset phase by first enabling or turning on the pull-up device MP1, and then turning on or enabling the pull-down device MN1, and providing logic 1 to the first input 'a', logic 0 to the second input 'b', logic 0 to the third input 'c', and logic 0 to the fourth input 'd'. In some embodiments, when the threshold is set to 2 in a reset phase by a particular sequencing of turning on/off the pull-up and the pull-down devices and conditioning of the inputs 'a', 'b', 'c' and 'd'; it means that during an evaluation phase when at least two of the four inputs 'a', 'b' 'c' and 'd' are logic high, then voltage on node n1 is logic high. Continuing with this example, when at least three inputs of the four inputs 'a' 'b', 'c' and 'd' is a logic low, then the voltage on node n1 resolves to logic low. As such, 4-input capacitive circuit 400 is programmed or configured as a 4-input majority 0 gate-like logic (e.g., a threshold gate with threshold of 2) at node n1 and a 4-input minority 0 gate-like logic (e.g., a threshold gate with threshold of 2) at output out. Since the number of inputs is even, the logic function is not a pure majority logic gate or minority logic gate, but one that behaves in a similar way. For example, when at least two inputs are high, then the voltage on summing node n1 is high.

In some embodiments, conditioning circuitry 402 sets the threshold to 3 in a reset phase by first enabling or turning on the pull-down device MN1, and then turning on or enabling the pull-up device MP1, and providing logic 1 to the first input 'a', logic 1 to the second input 'b', logic 1 to the third input 'c', and logic 0 to fourth input 'd'. In some embodiments, conditioning circuitry 402 sets the threshold to 3 in a reset phase by first enabling or turning on the pull-up device MP1, and then turning on or enabling the pull-down device MN1, and providing logic 1 to the first input 'a', logic 1 to the second input 'b', logic 0 to the third input 'c', and logic 0 to the fourth input 'd'. In some embodiments, when the threshold is set to 3 in a reset phase by a particular sequencing of turning on/off the pull-up and/or the pull-down devices and conditioning of the inputs 'a', 'b', 'c', and 'd'; it means that during an evaluation phase when at least three inputs from the four inputs 'a', 'b' 'c' and 'd' are logic high, then voltage on node n1 is logic high. Continuing with this example, when two or fewer inputs from the four inputs 'a' 'b' 'c' and 'd' are logic high, then the voltage on node n1 resolves to logic low. As such, 4-input capacitive circuit 400 is programmed or configured as a 4-input majority 1 gate-like logic (or a gate with threshold of 3) at node n1 and a 3-input minority 1 gate-like logic (or a gate with threshold of 3) at output out. Since the number of inputs is even, the logic function is not a pure majority logic gate or minority logic gate, but one that behaves in a similar way. For example, when at least three inputs are high, then the voltage on summing node n1 is high.

In some embodiments, conditioning circuitry 402 sets the threshold to 4 in a reset phase by first enabling or turning on the pull-down device MN1, and then turning on or enabling the pull-up device MP1, and providing logic 1 to the first input 'a', logic 1 to the second input 'b', logic 1 to the third input 'c', and logic 1 to fourth input 'd'. In some embodiments, when the threshold is set to 4 in a reset phase by a particular sequencing of turning on/off the pull-up and the pull-down devices and conditioning of the inputs 'a', 'b', 'c', and 'd'; it means that during an evaluation phase when all four inputs 'a', 'b' 'c', and 'd' are logic high, then voltage on node n1 is logic high. Continuing with this example, when any of the four inputs 'a' 'b', 'c', and 'd' is a logic low, then the voltage on node n1 resolves to logic low. As such, 4-input capacitive circuit 400 is programmed or configured as a 4-input AND at node n1 and a 4-input NAND gate at output out (assuming driver circuitry 231 is an inverter).

In some embodiments, conditioning circuitry 402 sets the threshold to 5 in a reset phase by first enabling or turning on the pull-up device MP1, and then turning on or enabling the pull-down device MN1, and providing logic 1 to all inputs 'a', 'b', 'c', and 'd'. A threshold of 5 for a 4-input capacitive circuit means that capacitive input circuit is an always off circuit regardless of the logic levels of the inputs. In one such embodiment, during the evaluation phase for the circuit configured with threshold of n+1 (e.g., 5, where 'n' is the number of capacitive inputs), the logic value on node n1 is floating and may eventually discharge to ground or charge to supply level. In some embodiments, the voltage on node n1 is zero volts regarding of input setting when the threshold in 5 (e.g., n+1).

So, the same circuit can be used as a majority/minority gate-like logic (or threshold gate), an OR/NOR gate, an AND/NAND, an always-on circuit, or a disconnected circuit by conditioning the inputs and resetting or setting the voltage on the summing node during a reset phase. Subsequently, in the evaluation phase the circuit will behave as a 4-input majority/minority gate-like logic (or threshold logic), 4-input AND/NAND gate, 4-input OR/NOR gate, a 4-input always-on gate, or a 4-input disconnected gate.

FIG. 4B illustrates flowchart 420 of a method to configure the 4-input capacitive circuit into a configurable threshold gate, in accordance with some embodiments. The blocks of flowchart 420 can be controlled by hardware, software, or a combination of them. At block 421, a decision is made about the kind of logic function to configure 4-input capacitive circuit 400. For example, a control logic block or a conditioning circuit 402 may determine whether 4-input capacitive circuit 400 is to behave as an always-on circuit, a disconnected circuit, a threshold gate, AND/NAND gate, an OR/NOR gate, a gate driving a predetermined output, or a disconnected gate. In some embodiments, control logic block or a conditioning circuit 402 may adjust a threshold of 4-input capacitive circuit 400 to configure the 4-input capacitive circuit 400 as a particular logic function.

At block 422, control logic block or a conditioning circuit 402 places 4-input capacitive circuit 400 in a reset phase. In the reset phase, the inputs 'a' 'b' 'c' and 'd' and controls for the pull-up device MP1 and pull-down device MN1 are set or conditioned in a sequence to configure the threshold for the 4-input capacitive circuit.

Table 7 illustrates an example of input conditioning to set various thresholds during a reset phase for 4-input capacitive circuit 400. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 7

| a | b | c | d | T1 | T2 | T3 | Threshold |
|---|---|---|---|---|---|---|---|
| 0 | 0 | 0 | 0 | 1 (enable MN1) | 0 (disable MN1) | 0 (enable MP1) | 0 |
| 1 | 0 | 0 | 0 | 1 (enable MN1) | 0 (disable MN1) | 0 (enable MP1) | 1 |
| 1 | 1 | 0 | 0 | 1 (enable MN1) | 0 (disable MN1) | 0 (enable MP1) | 2 |
| 1 | 1 | 1 | 0 | 1 (enable MN1) | 0 (disable MN1) | 0 (enable MP1) | 3 |
| 1 | 1 | 1 | 1 | 1 (enable MN1) | 0 (disable MN1) | 0 (enable MP1) | 4 |
| 0 | 0 | 0 | 0 | 0 (enable MP1) | 1 (disable MP1) | 1 (enable MN1) | 1 |
| 1 | 0 | 0 | 0 | 0 (enable MP1) | 1 (disable MP1) | 1 (enable MN1) | 2 |
| 1 | 1 | 0 | 0 | 0 (enable MP1) | 1 (disable MP1) | 1 (enable MN1) | 3 |
| 1 | 1 | 1 | 0 | 0 (enable MP1) | 1 (disable MP1) | 1 (enable MN1) | 4 |
| 1 | 1 | 1 | 0 | 0 (enable MP1) | 1 (disable MP1) | 1 (enable MN1) | 5 |

While the embodiments are illustrated with reference to same capacitances for first capacitor C1, the second capacitor C2, the third capacitor C3, and the fourth capacitor C4, the threshold can be affected by changing the capacitive ratio of C1, C2, C3, and C4 relative to one another. For example, the input conditioning scheme and the pull-up and pull-down device control can result in a different threshold than that in Table 5 when the capacitive ratio of C1, C2, C3, and C4 is not 1:1:1:1. Overall, the configuring scheme of various embodiments herein provide the flexibility of programming the threshold for 4-input capacitive circuit 400 in a reset phase to achieve a certain logic function in the evaluation phase.

At block 423, control logic block or a conditioning circuit 402 releases the reset phase and allows 4-input capacitive circuit 400 to evaluate the inputs in the evaluation phase. Table 8 illustrates a logic function achieved in the evaluation phase by configuring the threshold in the reset phase for 4-input capacitive circuit 400. In various embodiments, the pull-up device MP1 And the pull-down device MN1 are disabled during the evaluation phase.

TABLE 8

| Threshold | Logic Function on node n1 | Logic function on node "out" |
|---|---|---|
| 0 | Logic 1 | Logic 0 |
| 1 | OR | NOR |
| 2 | Majority 1 gate-like (or threshold gate with threshold of 2) | Minority 1 gate-like (or inverted threshold gate with threshold of 2) |
| 3 | Majority 0 gate-like (or threshold gate with threshold of 3) | Minority 0 gate-like (or inverted threshold gate with threshold of 3) |
| 4 | AND | NAND |
| 5 | Logic 0 | Logic 1 |

Figure 5:
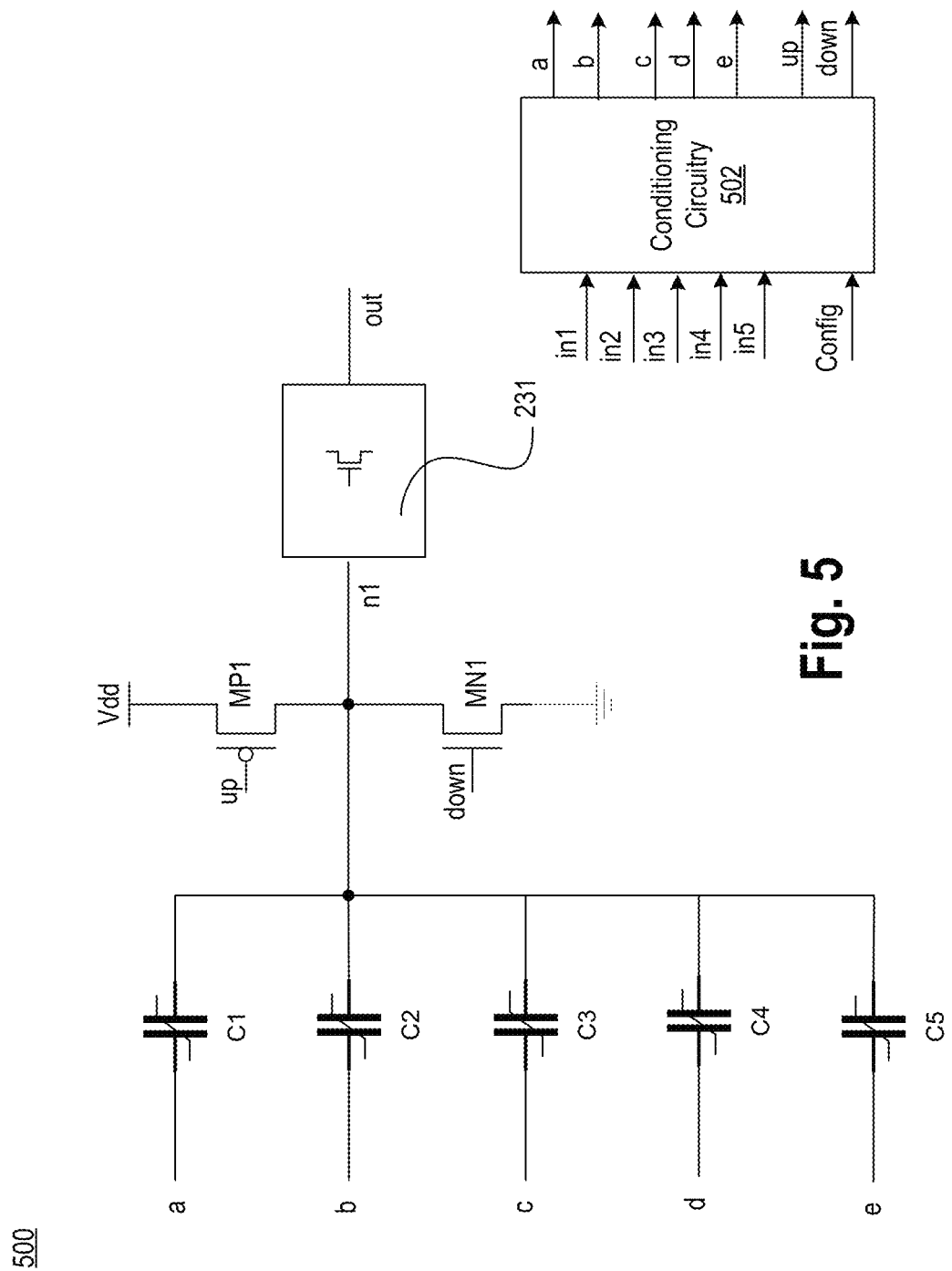
FIG. 5 illustrates a 5-input capacitive circuit with configurable threshold, in accordance with some embodiments.

FIG. 5 illustrates 5-input capacitive circuit 500 with configurable threshold, in accordance with some embodiments. 5-input capacitive circuit 500 is like 4-input capacitive circuit 400 but for additional input 'e' and associated capacitor C5. In some embodiments, a first terminal of capacitor C5 is coupled to input 'e' while a second terminal of capacitor C5 is coupled to summing node n1. Conditioning circuit 402 is replaced with a conditioning circuit 502. Conditioning circuitry 502 may receive inputs in1, in2, in3, in4, and in5 and configuration setting (e.g., reset or evaluation) to determine the outputs 'a', 'b', 'c', 'd', 'e', up, and down. During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned.

In some embodiments, by turning on/off the pull-up device MP1 and pull-down device MN1 in a sequence, and conditioning the inputs 'a', 'b', 'c', 'd', and 'e' during a reset phase, the charge at node n1 is set. As such, in an evaluation phase when the pull-up and pull-down devices (MP1 and MN1) are disabled, 5-input capacitive circuit 500 attains a desired function.

In some embodiments, conditioning circuitry 502 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c', logic 0 to the fourth input 'd', and logic 0 to the fifth input 'e'. A threshold of 0 means that conditioning circuitry 502 is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 502 sets the threshold to 1 in a reset phase by first enabling or turning on the pull-down device MN1, and then turning on or enabling the pull-up device MP1, and providing logic 1 to the first input 'a', logic 0 to the second input 'b', and logic 0 to the third input 'c', logic 0 to the fourth input 'd', and logic 0 to the fifth input 'e'. In some embodiments, conditioning circuitry 502 sets the threshold to 1 in a reset phase by first enabling or turning on the pull-up device MP1, and then turning on or enabling the pull-down device MN1, and providing logic 0 to the first input 'a', logic 0 to the second input 'b', and logic 0 to the third input 'c', logic 0 to the fourth input 'd', and logic 0 to the fifth input 'e'. In some embodiments, when the threshold is set to 1 in a reset phase by a particular sequencing of turning on/off the pull-up and the pull-down devices and conditioning of the inputs 'a' 'b', 'c', 'd', and 'e'; it means that during an evaluation phase when any of the inputs 'a' 'b', 'c', 'd', or 'e' is logic high, then voltage on node n1 is logic high. Continuing with this example, when all inputs 'a', 'b', 'c' 'd', or 'e' is a logic low, then the voltage on node n1 resolves to logic low. As such, 4-input capacitive circuit 500 is programmed or configured as an OR gate at node n1 and a NOR gate at output out.

In some embodiments, conditioning circuitry 502 sets the threshold to 2 in a reset phase by first enabling or turning on the pull-down device MN1, and then turning on or enabling the pull-up device MP1, and providing logic 1 to the first input 'a', logic 1 to the second input 'b', and logic 0 to the third input 'c', logic 0 to the fourth input 'd', and logic 0 to the fifth input 'e'. In some embodiments, conditioning circuitry 502 sets the threshold to 2 in a reset phase by first enabling or turning on the pull-up device MP1, and then turning on or enabling the pull-down device MN1, and providing logic 1 to the first input 'a', logic 0 to the second input 'b', and logic 0 to the third input 'c', logic 0 to the fourth input 'd', and logic 0 to the fifth input 'e'. In one instance, when the threshold is set to 2 in a reset phase by a particular sequencing of turning on/off the pull-up and the pull-down devices and conditioning of the inputs 'a', 'b', 'c', 'd', and 'e'; it means that during an evaluation phase when at least two of the five inputs 'a', 'b' 'c' 'd', and 'e' are logic high, then voltage on node n1 is logic high. Continuing with this example, when one or zero inputs of the five inputs 'a' 'b', 'c', 'd', and 'e' is a logic high, then the voltage on node n1 resolves to logic low. As such, 5-input capacitive circuit 500 is programmed or configured as a 5-input majority 0 gate-like logic (e.g., a threshold gate with a threshold of 2) at node n1 and a 5-input minority 0 gate-like logic (e.g., an inverted threshold gate with a threshold of 2) at output out.

In some embodiments, conditioning circuitry 502 sets the threshold to 3 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 0 to the fourth input 'd', and logic 0 to the fifth input 'e'. In some embodiments, conditioning circuitry 502 sets the threshold to 3 in a reset phase by first enabling or turning on the pull-up device MP1, and then turning on or enabling the pull-down device MN1, and providing logic 1 to the first input 'a', logic 1 to the second input 'b', and logic 0 to the third input 'c', logic 0 to the fourth input 'd', and logic 0 to the fifth input 'e'. In one instance, when the threshold is set to 3 in a reset phase by a particular sequencing of turning on/off the pull-up and/or the pull-down devices and conditioning of the inputs 'a', 'b', 'c', 'd', and 'e'; it means that during an evaluation phase when at least three of the five inputs 'a', 'b' 'c' 'd', and 'e' are logic high, then voltage on node n1 is logic high. Continuing with this example, when at least two inputs of the five inputs 'a' 'b', 'c', 'd', and 'e' is a logic low (or 2 or fewer inputs are logic high), then the voltage on node n1 resolves to logic low. As such, 5-input capacitive circuit 500 is programmed or configured as a 5-input majority gate logic at node n1 and a 5-input minority gate logic at output out (assuming driver circuitry 231 is an inverter).

In some embodiments, conditioning circuitry 502 sets the threshold to 4 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 0 to the fifth input 'e'. In some embodiments, conditioning circuitry 502 sets the threshold to 4 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 0 to the fourth input 'd', and logic 0 to the fifth input 'e'. In some embodiments, when the threshold is set to 4 in a reset phase by a particular sequencing of turning on/off the pull-up and the pull-down devices and conditioning of the inputs 'a', 'b', 'c', 'd', and 'e'; it means that during an evaluation phase when at least four inputs from the five inputs 'a', 'b' 'c', 'd' and 'e' are logic high, then voltage on node n1 is logic high. Continuing with this example, when three or fewer inputs from the five inputs 'a' 'b', 'c', 'd' and 'e' are logic high, then the voltage on node n1 resolves to logic low. As such, 5-input capacitive circuit 500 is programmed or configured as a 5-input majority 1 gate-like logic (e.g., a threshold gate with a threshold of 4) at node n1 and a 5-input minority 1 gate-like logic (e.g., an inverted threshold gate with a threshold of 4) at output out.

In some embodiments, conditioning circuitry 502 sets the threshold to 5 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 1 to the fifth input 'e'. In some embodiments, conditioning circuitry 502 sets the threshold to 5 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 0 to the fifth input 'e'. In some embodiments, when the threshold is set to 5 in a reset phase by a particular sequencing of turning on/off the pull-up and the pull-down devices and conditioning of the inputs 'a', 'b', 'c', 'd', and 'e'; it means that during an evaluation phase when all five inputs 'a', 'b' 'c', 'd', and 'e' are logic high, then voltage on node n1 is logic high. Continuing with this example, when any of the five inputs 'a' 'b' 'c', 'd', and 'e' is a logic low, then the voltage on node n1 resolves to logic low. As such, 5-input capacitive circuit 500 is programmed or configured as a 5-input AND at node n1 and a 5-input NAND gate at output out (assuming that the driver circuitry 231 is an inverter).

In some embodiments, conditioning circuitry 502 sets the threshold to 6 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 1 to the fifth input 'e'. A threshold of 6 for a 5-input capacitive circuit means that capacitive input circuit is an always off circuit regardless of the logic levels of the inputs. In one such embodiment, during the evaluation phase for the circuit configured with threshold of n+1 (e.g., 6, where 'n' is the number of capacitive inputs), the logic value on node n1 is floating and may eventually discharge to ground or charge to supply level. In some embodiments, the voltage on node n1 is zero volts regarding of input setting when the threshold in 6 (e.g., n+1).

So, the same circuit can be used as a majority/minority gate logic majority/minority gate-like logic (or threshold logic gate), AND/NAND, OR/NOR gate, a gate driving a predetermined output, or a disconnected gate by conditioning the inputs and resetting or setting the voltage on the summing node in a sequence during a reset phase. Subsequently, in the evaluation phase the circuit will behave as a 5-input majority/minority gate logic, 5-input majority/minority gate-like or threshold logic, 5-input AND/NAND gate, 5-input OR/NOR gate, an always-on gate, or a disconnected gate.

Table 9 illustrates an example of input conditioning to set various thresholds during a reset phase for 5-input capacitive circuit 500. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 9

| a | b | c | d | e | T1 | T2 | T3 | Threshold |
|---|---|---|---|---|---|---|---|---|
| 0 | 0 | 0 | 0 | 0 | 1 (enable MN1) | 0 (disable MN1) | 0 (enable MP1) | 0 |
| 1 | 0 | 0 | 0 | 0 | 1 (enable MN1) | 0 (disable MN1) | 0 (enable MP1) | 1 |
| 1 | 1 | 0 | 0 | 0 | 1 (enable MN1) | 0 (disable MN1) | 0 (enable MP1) | 2 |
| 1 | 1 | 1 | 0 | 0 | 1 (enable MN1) | 0 (disable MN1) | 0 (enable MP1) | 3 |
| 1 | 1 | 1 | 1 | 0 | 1 (enable MN1) | 0 (disable MN1) | 0 (enable MP1) | 4 |
| 1 | 1 | 1 | 1 | 1 | 1 (enable MN1) | 0 (disable MN1) | 0 (enable MP1) | 5 |
| 0 | 0 | 0 | 0 | 0 | 0 (enable MP1) | 1 (disable MP1) | 1 (enable MN1) | 1 |
| 1 | 0 | 0 | 0 | 0 | 0 (enable MP1) | 1 (disable MP1) | 1 (enable MN1) | 2 |
| 1 | 1 | 0 | 0 | 0 | 0 (enable MP1) | 1 (disable MP1) | 1 (enable MN1) | 3 |
| 1 | 1 | 1 | 0 | 0 | 0 (enable MP1) | 1 (disable MP1) | 1 (enable MN1) | 4 |
| 1 | 1 | 1 | 1 | 0 | 0 (enable MP1) | 1 (disable MP1) | 1 (enable MN1) | 5 |
| 1 | 1 | 1 | 1 | 1 | 0 (enable MP1) | 1 (disable MP1) | 1 (enable MN1) | 6 |

Table 10 illustrates a logic function achieved in the evaluation phase by configuring the threshold in the reset phase for 5-input capacitive circuit 500. In various embodiments, the pull-up device MP1 and the pull-down device MN1 are disabled during the evaluation phase.

TABLE 10

| Threshold | Logic Function on node n1 | Logic function on node "out" |
|---|---|---|
| 0 | Logic 1 | Logic 0 |
| 1 | OR | NOR |
| 2 | Majority 0 gate-like (e.g., a threshold gate with a threshold of 2) | Minority 0 gate-like (e.g., an inverted threshold gate with a threshold of 2) |
| 3 | Majority gate | Minority gate |
| 4 | Majority 1 gate-like (e.g., a threshold gate with a threshold of 4) | Minority 1 gate-like (e.g., an inverted threshold gate with a threshold of 4) |
| 5 | AND | NAND |
| 6 | Logic 0 | Logic 1 |

By setting inputs to have a particular number of 0s and 1s and at the same time controlling the logic level appearing at the summation node (n1) by controlling the pull-up and pull-down devices in a sequence, two effects are accomplished, in accordance with various embodiments. First, each capacitor stores a deterministic charge. Second, a specific displacement charge is put on the summing or floating node n1. Setting a specific displacement charge value at the floating node n1 sets the threshold of when the floating node (n1) during the evaluation phase is allowed to go to the logic value of 0 or 1. For example, for an n-input threshold gate, if the threshold is set such that the floating node n1 goes closer to 1 logic level than 0 logic level, when all of the inputs are set to 1, then the capacitive input circuit becomes a NAND gate. Similarly, if it is desired that any one input becomes logic 1 in the evaluation phase to give voltage closer to logic level 1 at the floating node, then the circuit becomes an OR gate with n-inputs. Similarly, any intermediate threshold from 0 to n can be set. In some embodiments, a threshold of zero means that the gate becomes a buffer. For instance, the circuit is always turned on to input logic level 1. A threshold of n+1 for an n-input gate means that the summation node n1 may not go closer to logic level 1, even when all the inputs are set to 1. This would mean that that the capacitive input circuit becomes a disconnected circuit.

In general, the input capacitive circuit when configured as a threshold gate, it can be expressed as:

$Y=1$ if $\Sigma_{j=1}^{m} W_j X_j \geq T$, $Y=0$ if $\Sigma_{j=1}^{m} W_j X_j < T$, Where 'Y' is the output (logic level on node n1), 'X' is the input, 'W' is the capacitive weight, and 'T' is the threshold.

Assuming all Ws are ones (e.g., all capacitors have the same capacitance), when T is equal to the number of inputs, and AND gate is realized at node n1. In this example, for a 3-input capacitive circuit, a 3 input AND gate is realized when threshold is set to 3. In another example, when T equals 1, a NOR gate is realized at node n1. In yet another example, when T is equal to 0, the input capacitive circuit is always on, and the voltage on node n1 is logic 1. In yet another example, when T is greater than the number of inputs to the circuit, the circuit is always off or disconnected. In this case, voltage on node n1 is floating and may over time leak away.

While the embodiments where are described with reference to up-to 5-input capacitive circuit using equal ratio for the capacitance, the same idea can be expanded to any number of input capacitive circuit with equal or unequal ratio for capacitances. In various embodiments, the capacitances are ferroelectric capacitors. In some embodiments, the ferroelectric capacitor are planar capacitors. In some embodiments, the ferroelectric capacitors are pillar or trench capacitors. In some embodiments, the ferroelectric capacitors are vertically stacked capacitors to reduce the overall footprint of the multi-input capacitive circuit.

In some embodiments, the transistors (MP1 and MN1) that charge or discharge the summing node n1 are planar or non-planar transistors. In some embodiments, transistors MP1 and MN1 are fabricated in the front-end of the die on a substrate. In some embodiments, one of the transistors (e.g., MP1 or MN1) is fabricated in the front-end of the die while another one of the transistors is fabricated in the backend of the end such that the stack of capacitors is between the frontend of the die and the backend of the die or between the two transistors. As such, the footprint of the multi-input capacitive circuit may be a footprint of a single transistor or slightly more than that. These backed transistors or switches can be fabricated using any suitable technology such as IGZO (Indium gallium zinc oxide). In some embodiments, the ferroelectric capacitors can be formed using transistors configured as capacitors, where transistor gates have ferroelectric material. These capacitors can be on the frontend or the backend of the die.

While the various embodiments are described with reference to driver circuitry 231 connected at node n1, driver circuitry 231 can be removed. When input capacitors for a capacitive input circuit are linear capacitors (e.g., comprising linear dielectric material), the voltage developed at node n1 may not reach rail-to-rail. As such, the subsequent driver circuitry 231 connected to node n1 may experience static leakage. Static leakage increases power consumption. In various embodiments, when input capacitors comprise non-linear polar material (e.g., ferroelectric material), then the voltage developed on node n1 results in reduced static leakage in the subsequent driver circuitry 231. One reason for this reduced leakage is because ferroelectric material in the input capacitors allow for voltage on node n1 to reach closer to rail-to-rail voltage, which reduces static leakage in subsequent driver circuitry 231. Here, summation node n1 can maintain displacement charge (to provide logic 0 or logic 1 functions for the programmed threshold) for longer period compared to linear capacitors. Consequently, the reset overhead of turning on/off the pull-up or pull-down devices is reduced. For example, when the leakage at the summation node n1 is low, the pull-up or pull-down devices may not need to turn on for tens of microseconds, which reduces the reset activity on node n1. Thus, circuit using non-linear capacitors (e.g., ferroelectric capacitor) in this configuration become a viable option to realize low leakage logic circuits for advanced process technology nodes (e.g., advanced finFET process technology node).

Since, the voltage on node n1 is closer to rail-to-rail voltage compared to the case when linear input capacitors are used, subsequent driver circuitry 231 can be removed. As such, the input capacitors with non-linear polar material can drive another capacitive input circuit directly.

FIG. 6A illustrates planar capacitor structure 600, in accordance with some embodiments. Planar capacitor structure 600 is a simplified structure. In some embodiments, capacitors for the multi-input capacitive structures are ferroelectric capacitors. These capacitors can take any planar form. One such simplified form is illustrated in FIG. 6A. Here, planar capacitor structure 600 is a metal-insulator-metal (MIM) capacitor comprising a bottom electrode, a top electrode, and a ferroelectric dielectric between the top electrode and the bottom electrode as shown. In some embodiments, conductive oxide layer(s) are formed between the bottom electrode and the ferroelectric dielectric.

FIG. 6B illustrates three planar capacitor structures 623a, 623b, and 623c, respectively, in accordance with some embodiments. Here, any one of the three planar capacitor structures 623a, 623b, and 623c is represented by the simplified planar capacitor structure 600.

In some embodiments, planar capacitor 623a incudes encapsulation portions 621a and 621b that are adjacent to the side walls of the plurality of layers of the planar capacitor. In some embodiments, planar capacitor 623b incudes encapsulation portions 621c and 621d that are partially adjacent to sidewall barrier seal 621a and 621b, and refractive inter-metallic layers 611a. In various embodiments, encapsulation portions 621c and 621d terminate into a via (not shown). The material for encapsulation portions 621c and 621d is same as those for sidewall barrier seal 621a and 621b. In some embodiments, the barrier material includes one or more of an oxide of: Ti, Al, or Mg.

In some embodiments, planar capacitor 623c includes encapsulation portions 621e and 621f that are partially adjacent to sidewall barrier seal 621a and 621b, and refractive inter-metallic layers 611b. In various embodiments, encapsulation portions 621e and 621f terminate into a via (not shown). The material for encapsulation portions 621e and 621f is same as those for sidewall barrier seal 621a and 621b. Material for 612a and 621b includes one or more of: Ti—Al—O, Al2O3, MgO, or nitride. Material for 612a and 621b is a sidewall barrier (e.g., insulative material) that protects the stack of layers from hydrogen and/or oxygen diffusion. In various embodiments, the sidewall barrier material is not an interlayer dielectric (ILD) material. In some embodiments, the lateral thickness (along x-axis) of the sidewall barrier seal 621a/b (insulating material) is in a range of 0.1 nm to 20 nm. In some embodiments, sidewall barriers are in direct contact with ILD.

In some embodiments, planar capacitors 623a, 623b, and 623c comprise a number of layers stacked together to form a planar capacitor. These layers may be extending in an x-plane when the capacitor is a planar capacitor. In some embodiments, the stack of layers includes refractive inter-metallic 611a/b as a barrier material; conductive oxides 612a/b, and FE material 613. FE material 613 can be any of the FE materials discussed herein. In some embodiments, refractive inter-metallic 611a/b are removed and electrodes are in direct contact with conductive oxides 612a/b.

In some embodiments, refractive inter-metallic 611a/b maintains the FE properties of the FE capacitor. In the absence of refractive inter-metallic 611a/b, the ferroelectric material 613 of the capacitor may lose its potency. In some embodiments, refractive inter-metallic 611a/b comprises Ti and Al (e.g., TiAl compound). In some embodiments, refractive inter-metallic 611a/b comprises one or more of Ta, W, and/or Co. For example, refractive inter-metallic 611a/b includes a lattice of Ta, W, and Co.

In some embodiments, refractive inter-metallic 611a/b is part of a barrier layer which is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer is matched with the lattice parameters of the conductive oxides and/or FE material 613.

In some embodiments, refractive inter-metallic 611a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. In some embodiments, barrier layer 311a is coupled to a top electrode. In some embodiments, sidewall barrier seal 621a/b (insulating material) is placed around layers 611a, 612a, 613, 612b, and 611b along while the top and bottom surfaces of 611a and 611b are exposed for coupling to metal layers, vias, or a metallic pedestal.

In some embodiments, conductive oxide layer(s) are formed between the top electrode and the ferroelectric dielectric. Examples of conductive oxides include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn.

Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 7A:
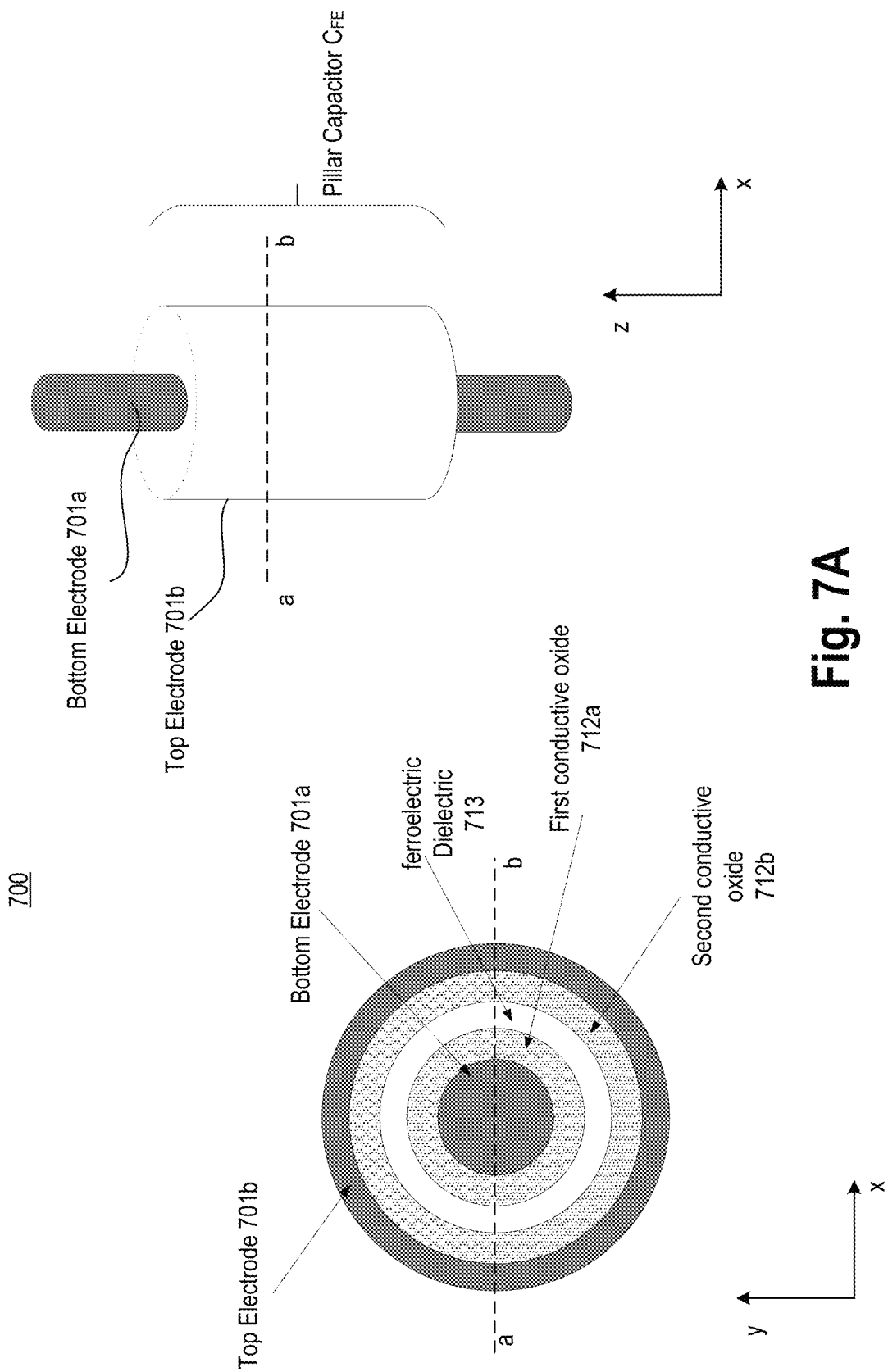
FIG. 7A illustrates a non-planar capacitor structure, in accordance with some embodiments.

FIG. 7A illustrates non-planar capacitor structure 700, in accordance with some embodiments. In some embodiments, non-planar capacitor structure 700 is rectangular in shape. Taking the cylindrical shaped case for example, in some embodiments, the layers of non-planar capacitor structure 700 from the center going outwards include bottom electrode 701a, first conductive oxide 712a, ferroelectric dielectric material 713, second conductive oxide 712b, and top electrode 701b. A cross-sectional view along the "ab" dashed line is illustrated in the middle of FIG. 7A. In some embodiments, conducting oxides are removed and the ferroelectric dielectric is directly connected to top electrode 701b and bottom electrodes 701a. In some embodiments, ferroelectric dielectric material 713 can include any suitable dielectric, where the thickness of dielectric film is a range of 1 nm to 20 nm. In some embodiments, ferroelectric dielectric material 713 include any one of the materials discussed herein for ferroelectrics.

In some embodiments, first conductive oxide 712a is conformally deposited over bottom electrode 701a. In some embodiments, dielectric material 713 is conformally deposited over first conductive oxide 712a. In some embodiments, second conductive oxide 712b is conformally deposited over dielectric material 713. In some embodiments, top electrode 701b is conformally deposited over second conductive oxide 712b. In some embodiments, bottom electrode 701a is in the center while top electrode 701b is on an outer circumference of non-planar capacitor structure 700.

In some embodiments, material for bottom electrode 701a may include one or more of: Cu, Al, Ag, Au, W, or Co, or their alloys. In some embodiments, material for first conductive oxide 712a include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn. In some embodiments, material for second conductive oxide 712b may be same as the material for first conductive oxide 712a. In some embodiments, material for top electrode 701b may include one or more of: Cu, Al, Ag, Au, W, or Co, or their alloys.

In some embodiments, a first refractive inter-metallic layer (not shown) is formed between dielectric material 713 and first conductive oxide 712a. In some embodiments, a second refractive inter-metallic layer (not shown) is formed between dielectric capacitor material 713 and second conductive oxide 712b. In these cases, the first and second refractive inter-metallic layers are directly adjacent to their respective conductive oxide layers and to dielectric capacitor material 713. In some embodiments, refractive inter-metallic maintains the capacitive properties of the dielectric capacitor material 713. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1-5% of Si, B, and/or Mg. In some embodiments, TiAl is a single-phase alloy γ(TiAl). In some embodiments, TiAl is a two-phase alloy γ(TiAl)+α2(Ti3Al). Single-phase y alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 700 in the x-axis are in the range of 1 nm to 30 nm. In some embodiment, refractive inter-metallic layers are not used for non-planar capacitor structure 700.

Figure 7B:
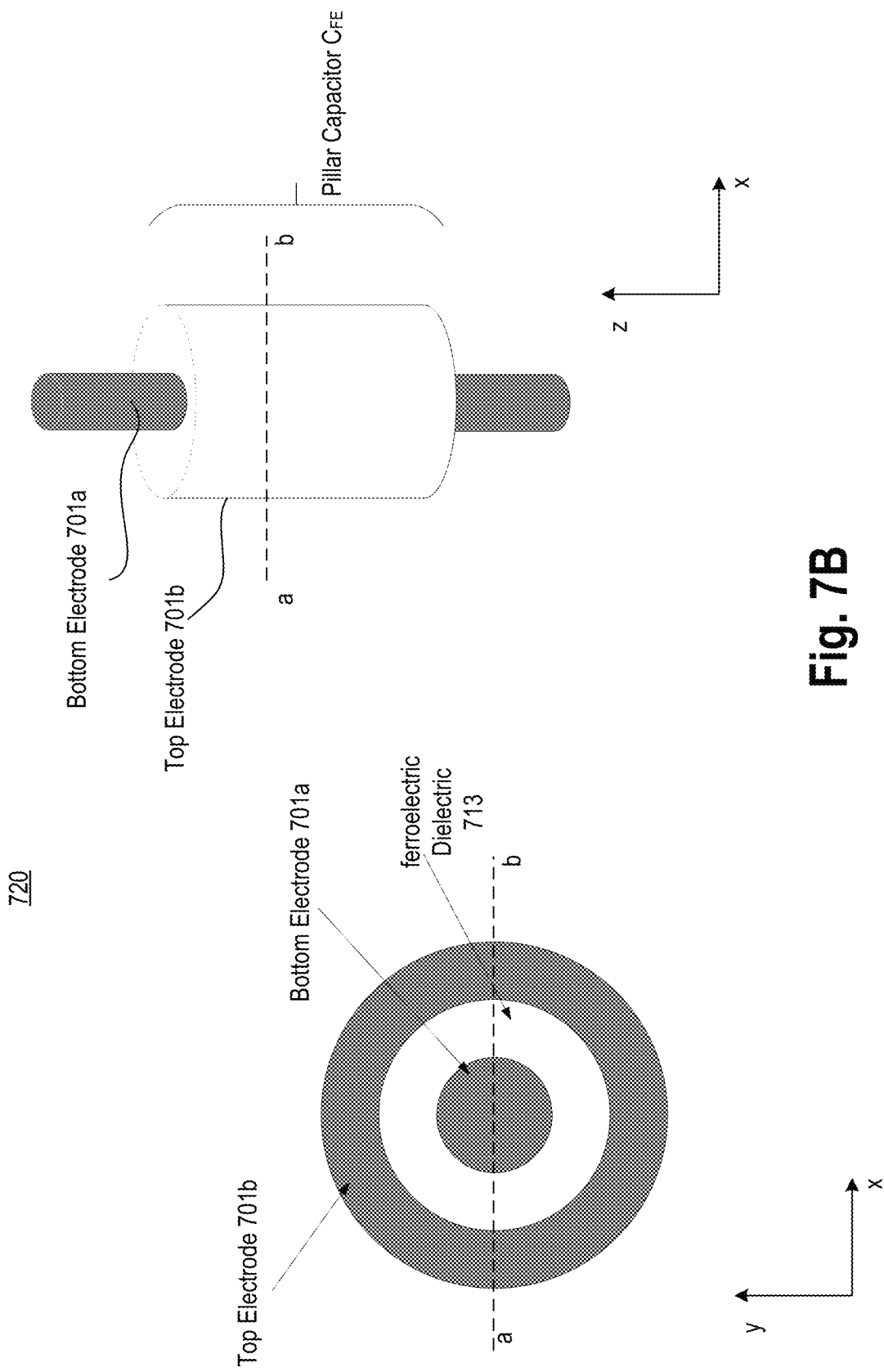
FIG. 7B illustrates a non-planar capacitor structure without conductive oxides, in accordance with some embodiments.

FIG. 7B illustrates non-planar capacitor structure 720 without conductive oxides, in accordance with some embodiments. Compared to non-planar capacitor structure 700, here first conductive oxide 712a and second conductive oxide 712b are removed and ferroelectric material 713 is adjacent to top electrode 701b and bottom electrode 710a as shown.

Figure 8:
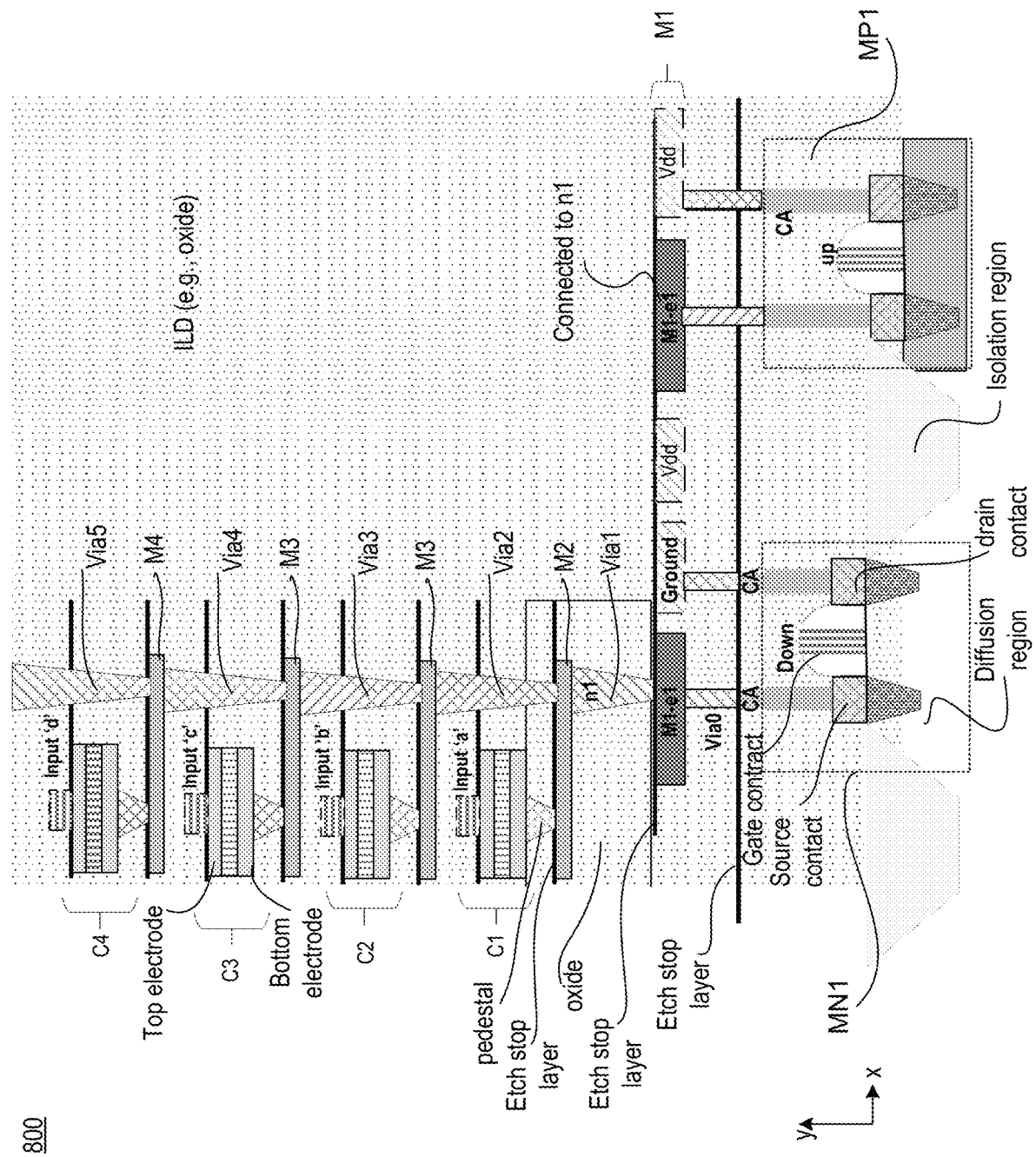
FIG. 8 illustrates a multi-input capacitive circuit with stacked planar capacitor structure, wherein the multi-input capacitive circuit includes a pull-up device and a pull-down device, in accordance with some embodiments.

FIG. 8 illustrates multi-input capacitive circuit 800 with stacked planar capacitor structure, wherein the multi-input capacitive circuit includes a pull-down device and a pull-up device, in accordance with some embodiments. In this example, two transistors are shown, each controlled by its respective Up or Down controls on its gate terminal. The source and drain terminals of each transistor is coupled to respective contacts (CA). Etch stop layer is used in the fabrication of vias (via0) to connect the source or drain of the transistors to summing node n1 on metal-1 (M1) layer. Another etch stop layer is formed over M1 layer to fabricate vias (via1) to couple to respective M1 layers. In some embodiments, metal-2 (M2) is deposited over vias (via1). M2 layer is then polished. In some embodiments, the ferroelectric capacitor can be moved further up in the stack, where the capacitor level processing is done between different layers.

In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the ferroelectric dielectric capacitors are formed in a backend of the die. In some embodiments, deposition of ILD is followed by surface polish. In some embodiments, a metal layer is formed over top electrode of each capacitor to connect to a respective input. For example, metal layer over the top electrode of capacitor C1 is connected to input 'a'. Metal layer over the top electrode of capacitor C2 is connected to input 'b'. Metal layer over the top electrode of capacitor C3 is connected to input 'c'. Metal layer over the top electrode of capacitor C4 is connected to input 'd'. The metal layers coupled to the bottom electrodes of capacitors C1, C2, C3, and C4 are coupled to summing node n1 through respective vias.

In this case, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to input electrode (e.g., input 'a', input 'b', input 'c', and input 'd') and summing node n1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated 'n' times for forming 'n' capacitors in a stack for 'n' number of inputs, in accordance with some embodiments.

In some embodiments, the bottom electrode of each capacitor is allowed to directly contact with the metal below. For example, the pedestals that connect to the top and bottom electrodes are removed. In this embodiment, the height of the stacked capacitors is lowered, and the fabrication process is simplified because the extra steps for forming the pedestals are removed.

In some embodiments, pedestals or vias are formed for both the top and bottom electrodes of the planar capacitors. In this embodiment, the height of the stacked capacitors is raised, and the fabrication process adds an additional step of forming a top pedestal or via which contacts with respective input electrodes (e.g., input 'a', input 'b', input 'c', and input 'd').

Figure 9:
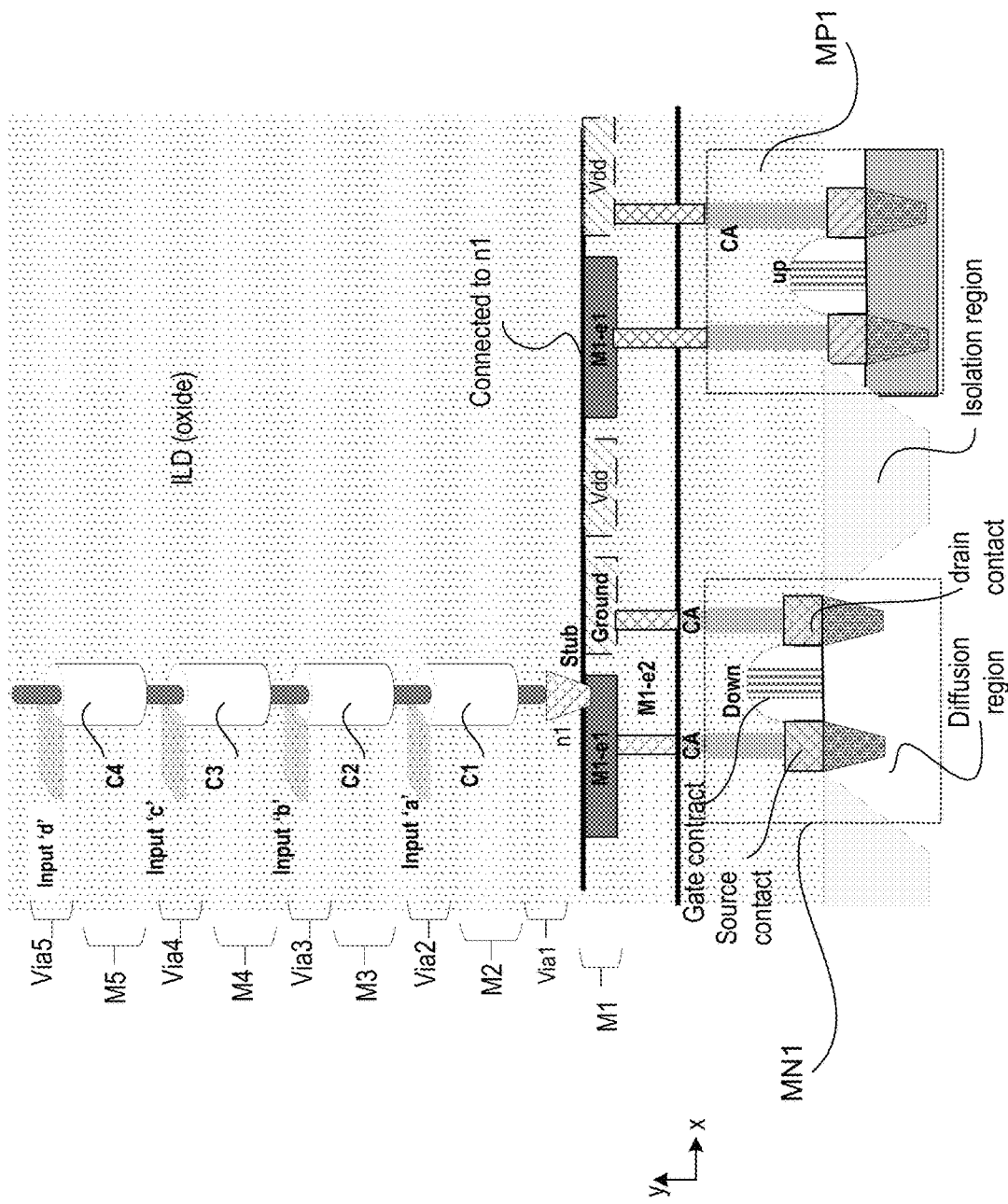
FIG. 9 illustrates a multi-input capacitive circuit with stacked non-planar capacitor structure wherein the multi-input capacitive circuit includes a pull-up device and a pull-down device, in accordance with some embodiments.

FIG. 9 illustrates multi-input capacitive circuit 900 with stacked non-planar capacitor structure (e.g., structures of FIG. 7A or FIG. 7B), wherein the multi-input capacitive circuit includes a pull-down device and a pull-up device, in accordance with some embodiments. In this example four capacitors are stacked. In some embodiments, a column of shared passes through the center of the capacitors, where the shared metal is the summing node n1 which is coupled to the stub and then to the source or drain terminals of the pull-up (MP1) and pull-down (MN1) transistors. Top electrode of each of the capacitor is partially adjacent to a respective input electrode. For example, the top electrode of capacitor C1 is coupled to input electrode 'a', the top electrode of capacitor C2 is coupled to input electrode 'b', the top electrode of capacitor C3 is coupled to input electrode 'c', and the top electrode of capacitor C4 is coupled to input electrode 'd'. In this instance, the capacitors are formed between regions reserved for Via1 through Via5 (e.g., between M1 through M6 layers).

Figure 10:
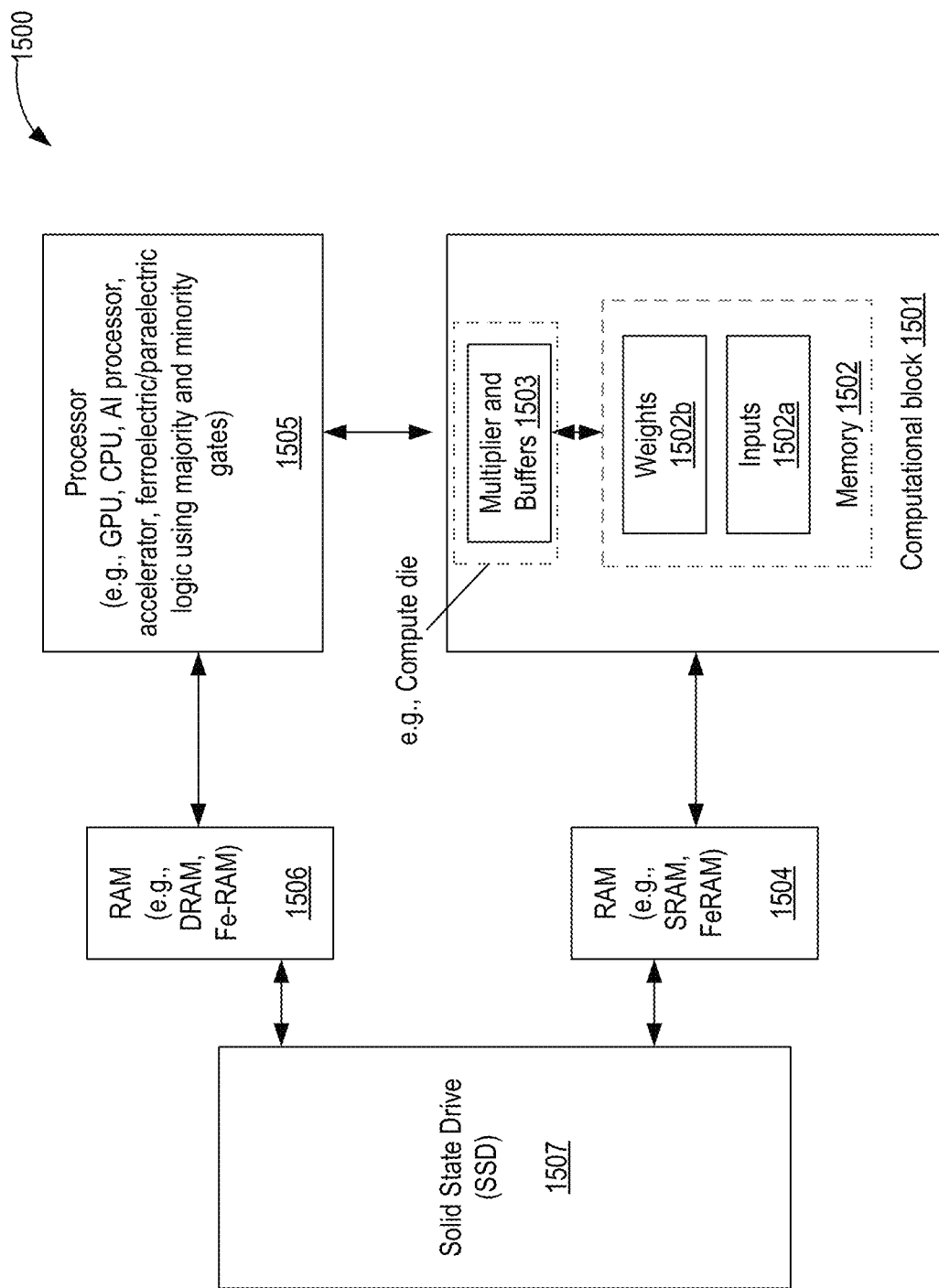
FIG. 10 illustrates a high-level architecture of an artificial intelligence (AI) machine comprising a compute die stacked with a memory die, wherein the compute die includes a multi-input capacitive circuit with configurable threshold, in accordance with some embodiments.

FIG. 10 illustrates a high-level architecture of an artificial intelligence (AI) machine comprising a compute die stacked with a memory die, wherein the compute die includes any one of the input capacitive circuit with configurable threshold. AI machine 1500 comprises computational block 1501 or processor having random-access memory (RAM) 1502 and computational logic 1503; first random-access memory 1504 (e.g., static RAM (SRAM), ferroelectric or paraelectric RAM (FeRAM), ferroelectric or paraelectric static random-access memory (FeSRAM)), main processor 1505, second random-access memory 1506 (dynamic RAM (DRAM), FeRAM), and solid-state memory or drive (SSD) 1507. In some embodiments, some or all components of AI machine 1500 are packaged in a single package forming a system-on-chip (SoC). The SoC can be configured as a logic-on-logic configuration, which can be in a 3D configuration or a 2.5D configuration.

In some embodiments, computational block 1501 is packaged in a single package and then coupled to processor 1505 and memories 1504, 1506, and 1507 on a printed circuit board (PCB). In some embodiments, computational block 1501 is configured as a logic-on-logic configuration, which can be in a 3D configuration or a 2.5D configuration. In some embodiments, computational block 1501 comprises a special purpose compute die 1503 or microprocessor. For example, compute die 1503 is a compute chiplet that performs a function of an accelerator or inference. In some embodiments, memory 1502 is DRAM which forms a special memory/cache for the special purpose compute die 1503. The DRAM can be embedded DRAM (eDRAM) such as 1T1C (one transistor and one capacitor) based memories. In some embodiments, RAM 1502 is ferroelectric or paraelectric RAM (Fe-RAM).

In some embodiments, compute die 1503 is specialized for applications such as Artificial Intelligence, graph processing, and algorithms for data processing. In some embodiments, compute die 1503 further has logic computational blocks, for example, for multipliers and buffers, a special data memory block (e.g., buffers) comprising DRAM, FeRAM, or a combination of them. In some embodiments, RAM 1502 has weights and inputs stored to improve the computational efficiency. The interconnects between processor 1505 (also referred to as special purpose processor), first RAM 1504 and compute die 1503 are optimized for high bandwidth and low latency. The architecture of FIG. 10 allows efficient packaging to lower the energy, power, or cost and provides for ultra-high bandwidth between RAM 1502 and compute chiplet 1503 of computational block 1501.

In some embodiments, RAM 1502 is partitioned to store input data (or data to be processed) 1502a and weight factors 1502b. In some embodiments, input data 1502a is stored in a separate memory (e.g., a separate memory die) and weight factors 1502b are stored in a separate memory (e.g., separate memory die).

In some embodiments, computational logic or compute chiplet 1503 comprises matrix multiplier, adder, concatenation logic, buffers, and combinational logic. In various embodiments, compute chiplet 1503 performs multiplication operation on inputs 1502a and weights 1502b. In some embodiments, weights 1502b are fixed weights. For example, processor 1505 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1502. In various embodiments, the input data that is to be analyzed using a trained model, is processed by computational block 1501 with computed weights 1502b to generate an output (e.g., a classification result).

In some embodiments, first RAM 1504 is ferroelectric or paraelectric based SRAM. For example, a six transistor (6T) SRAM bit-cells having ferroelectric or paraelectric transistors are used to implement a non-volatile FeSRAM. In some embodiments, SSD 1507 comprises NAND flash cells. In some embodiments, SSD 1507 comprises NOR flash cells. In some embodiments, SSD 1507 comprises multi-threshold NAND flash cells.

In various embodiments, the non-volatility of FeRAM is used to introduce new features such as security, functional safety, and faster reboot time of AI machine 1500. The non-volatile FeRAM is a low power RAM that provides fast access to data and weights. FeRAM 1504 can also serve as a fast storage for computational block 1501 (which can be an inference die or an accelerator), which typically has low capacity and fast access requirements.

In various embodiments, the FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the non-linear polar materials described herein.

Figure 11:
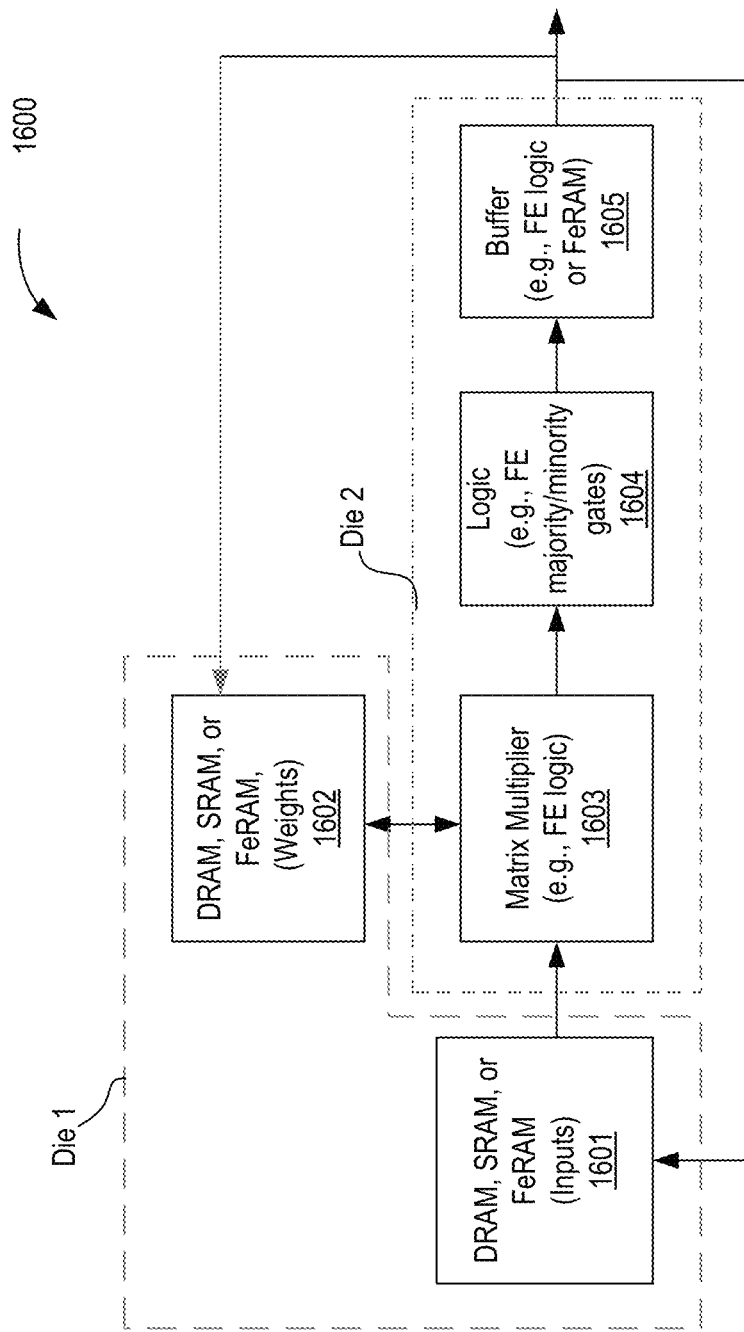
FIG. 11 illustrates an architecture of a computational block comprising a compute die stacked with a memory die, wherein the compute die includes any one of the multi-input capacitive circuit with configurable threshold, in accordance with some embodiments.

FIG. 11 illustrates an architecture of a computational block 1600 comprising a compute die stacked with a memory die, wherein the compute die includes any one of the input capacitive circuit with configurable threshold, in accordance with some embodiments. Any of the blocks here can include the bit-cell of various embodiments. The architecture of FIG. 11 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 1601 to store input data and a second die 1602 to store weight factors. In some embodiments, the memory die is a single die that is partitioned such that first partition 1601 of the memory die is used to store input data and second partition 1602 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1601 and 1602, or memory dies 1601 and 1602 include one or more of: DRAM, FE-SRAM, FE-DRAM, SRAM, and/or MRAM. In some embodiments, the input data stored in memory partition or die 1601 is the data to be analyzed by a trained model with fixed weights stored in memory partition or die 1602.

In some embodiments, the compute die comprises ferroelectric or paraelectric logic (e.g., majority, minority, and/or threshold gates) to implement matrix multiplier 1603, logic 1604, and temporary buffer 1605. Matrix multiplier 1603 performs multiplication operation on input data 'X' and weights 'W' to generate an output 'Y'. This output may be further processed by logic 1604. In some embodiments, logic 1604 performs a threshold operation, pooling and drop out operations, and/or concatenation operations to complete the AI logic primitive functions.

In some embodiments, the output of logic 1604 (e.g., processed output 'Y') is temporarily stored in buffer 1605. In some embodiments, buffer 1605 is memory such as one or more of: DRAM, Fe-SRAM, Fe-DRAM, MRAM, resistive RAM (Re-RAM) and/or SRAM. In some embodiments, buffer 1605 is part of the memory die (e.g., Die 1). In some embodiments, buffer 1605 performs the function of a re-timer. In some embodiments, the output of buffer 1605 (e.g., processed output 'Y') is used to modify the weights in memory partition or die 1602. In one such embodiment, computational block 1600 not only operates as an inference circuitry, but also as a training circuitry to train a model. In some embodiments, matrix multiplier 1603 includes an array of multiplier cells, wherein the DRAMs 1601 and 1602 include arrays of memory bit-cells, respectively, wherein each multiplier cell is coupled to a corresponding memory bit-cell of DRAM 1601 and/or DRAM 1602. In some embodiments, computational block 1600 comprises an interconnect fabric coupled to the array of multiplier cells such that each multiplier cell is coupled to the interconnect fabric.

Architecture 1600 provides reduced memory access for the compute die (e.g., die 2) by providing data locality for weights, inputs, and outputs. In one example, data from and to the AI computational blocks (e.g., matrix multiplier 1603) is locally processed within a same packaging unit. Architecture 1600 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 12:
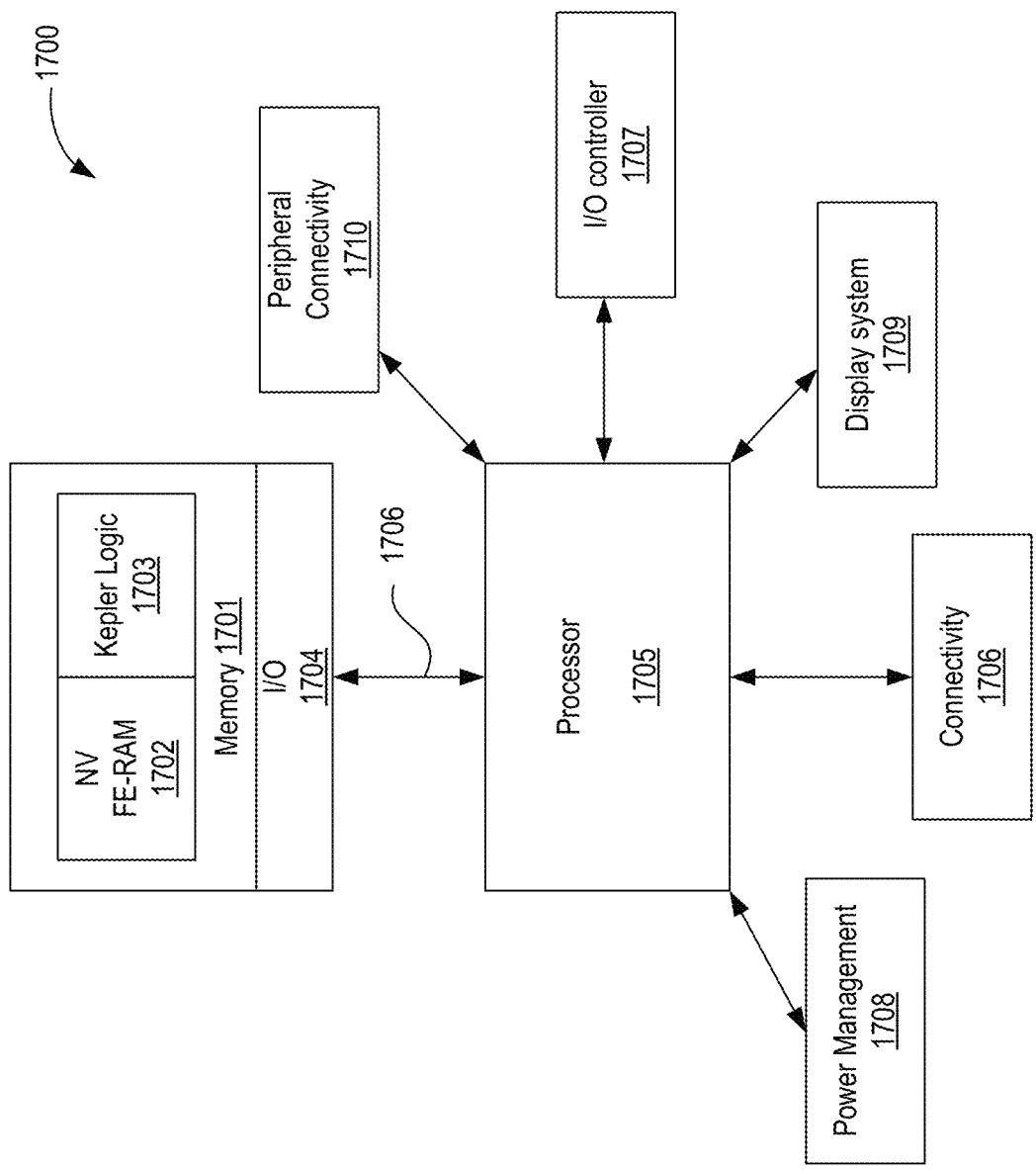
FIG. 12 illustrates a system-on-chip (SOC) that uses any one of the multi-input capacitive circuit with configurable threshold, in accordance with some embodiments.

FIG. 12 illustrates a system-on-chip (SOC) 1700 that uses any one of the input capacitive circuit with configurable threshold, in accordance with some embodiments. SoC 1700 comprises memory 1701 having static random-access memory (SRAM) or FE based random-access memory FE-RAM, or any other suitable memory. The memory can be non-volatile (NV) or volatile memory. Memory 1701 may also comprise logic 1703 to control memory 1702. For example, write and read drivers are part of logic 1703. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 1704. The interface may be a double-data rate (DDR) compliant interface or any other suitable interface to communicate with a processor. Processor 1705 of SoC 1700 can be a single core or multiple core processor. Processor 1705 can be a general-purpose processor (CPU), a digital signal processor (DSP), or an Application Specific Integrated Circuit (ASIC) processor. In some embodiments, processor 1705 is an artificial intelligence (AI) processor (e.g., a dedicated AI processor, a graphics processor configured as an AI processor). In various embodiments, processor 1705 executes instructions that are stored in memory 1701.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 1705 may be coupled to a number of other chip-lets that can be on the same die as SoC 1700 or on separate dies. These chip-lets include connectivity circuitry 1706, I/O controller 1707, power management 1708, and display system 1709, and peripheral connectivity 1706.

Connectivity 1706 represents hardware devices and software components for communicating with other devices. Connectivity 1706 may support various connectivity circuitries and standards. For example, connectivity 1706 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR)

system or variations or derivatives, or other cellular service standards. In some embodiments, connectivity 1706 may support non-cellular standards such as WiFi.

I/O controller 1707 represents hardware devices and software components related to interaction with a user. I/O controller 1707 is operable to manage hardware that is part of an audio subsystem and/or display subsystem. For example, input through a microphone or other audio device can provide input or commands for one or more applications or functions of SoC 1700. In some embodiments, I/O controller 1707 illustrates a connection point for additional devices that connect to SoC 1700 through which a user might interact with the system. For example, devices that can be attached to the SoC 1700 might include microphone devices, speaker or stereo systems, video systems or other display devices, keyboard or keypad devices, or other I/O devices for use with specific applications such as card readers or other devices.

Power management 1708 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1708 may accordingly put such logic into low power state without the worry of losing data. Power management may select a power state according to Advanced Configuration and Power Interface (ACPI) specification for one or all components of SoC 1700.

Display system 1709 represents hardware (e.g., display devices) and software (e.g., drivers) components that provide a visual and/or tactile display for a user to interact with the processor 1705. In some embodiments, display system 1709 includes a touch screen (or touch pad) device that provides both output and input to a user. Display system 1709 may include a display interface, which includes the particular screen or hardware device used to provide a display to a user. In some embodiments, the display interface includes logic separate from processor 1705 to perform at least some processing related to the display.

Peripheral connectivity 1710 may represent hardware devices and/or software devices for connecting to peripheral devices such as printers, chargers, cameras, etc. In some embodiments, peripheral connectivity 1710 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 1700 includes a coherent cache or memory-side buffer chiplet (not shown) which include ferroelectric or paraelectric memory. The coherent cache or memory-side buffer chiplet can be coupled to processor 1705 and/or memory 1701 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a first input; a second input; a summing node; a first capacitor having a first terminal coupled to the first input and a second terminal coupled to the summing node, wherein the first capacitor comprises a first ferroelectric material; a second capacitor having a third terminal coupled to the second input and a fourth terminal coupled to the summing node, wherein the second capacitor comprises a second ferroelectric material; a pull-up device coupled to the summing node and a power supply rail, wherein the pull-up device is controlled by a first control; and a pull-down device coupled to the summing node and a ground, wherein the pull-down device is controlled by a second control, wherein the first input, the second input, the first control, and the second control are set in a first operation mode to adjust a threshold of the apparatus.

Example 2: The apparatus of example 1, wherein the first control is to cause the pull-up device to be off in a second operation mode, wherein the second control is to cause the pull-down device to be off in the second operation mode, wherein the second operation mode occurs after the first operation mode.

Example 3: The apparatus of example 1, wherein the first control and the second control are set sequentially in the first operation mode.

Example 4: The apparatus of example 1, wherein the first ferroelectric material or the second ferroelectric material includes one or more of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100.

Example 5: The apparatus of example 1, wherein, in the first operation mode, the threshold of the apparatus is adjusted to 0 after the pull-down device is enabled first, and then the pull-down device is disabled, and then the pull-up device is enabled, and the first input is set to logic 0 and the second input is set to logic 0.

Example 6: The apparatus of example 1, wherein, in the first operation mode, the threshold of the apparatus is adjusted to 1 after the pull-down device is enabled first, and then the pull-down device is disabled, and then the pull-up device is enabled, and the first input is set to logic 1 and the second input is set to logic 0.

Example 7: The apparatus of example 1, wherein, in the first operation mode, the threshold of the apparatus is adjusted to 1 after the pull-up device is enabled first, and then the pull-up device is disabled, and then the pull-down device is enabled, and the first input is set to logic 0 and the second input is set to logic 0.

Example 8: The apparatus of example 1, wherein, in the first operation mode, the threshold of the apparatus is adjusted to 2 after the pull-down device is enabled first, and then the pull-down device is disabled, and then the pull-up device is enabled, and the first input is set to logic 1 and the second input is set to logic 1.

Example 9: The apparatus of example 1, wherein, in the first operation mode, the threshold of the apparatus is adjusted to 2 after the pull-up device is enabled first, and then the pull-up device is disabled, and then the pull-down device is enabled, and the first input is set to logic 1 and the second input is set to logic 0.

Example 10: The apparatus of example 1, wherein, in the first operation mode, the threshold of the apparatus is adjusted to 3 after the pull-up device is enabled first, and then the pull-up device is disabled, and then the pull-down device is enabled, and the first input is set to logic 1 and the second input is set to logic 1.

Example 11: The apparatus of example 1, wherein the first ferroelectric material is between a top electrode and a bottom electrode, wherein the top electrode or the bottom electrode include one or more of: Cu, Al, Ag, Au, W, or Co.

Example 12: The apparatus of example 1, wherein capacitance of the first capacitor is substantially equal to the capacitance of the second capacitor.

Example 13: The apparatus of example 1, wherein capacitance of the first capacitor is substantially different to the capacitance of the second capacitor.

Example 14: An apparatus comprising: a capacitive input circuit having a first input, a second input, a first control, and a second control, wherein the first control is to pull-up a voltage on a summing node to a supply rail, wherein the second control is to pull-down a voltage on the summing node to a ground, wherein the summing node is coupled to a first capacitor and a second capacitor of the capacitive input circuit, wherein the first input is received by the first capacitor, wherein the second input is received by the second capacitor, wherein the first capacitor comprises a first ferroelectric material, wherein the second capacitor comprises a second ferroelectric material; and a circuit to configure the first input, the second input, the first control, and the second control during a reset phase to adjust a threshold of the capacitive input circuit.

Example 15: The apparatus of example 14, wherein the circuit is to configure a logic function of the capacitive input circuit by adjustment of the threshold of the capacitive input circuit.

Example 16: The apparatus of example 14, wherein the circuit controls the first control and the second control to sequentially pull-up the voltage on the summing node and pull-down the voltage on the summing node.

Example 17: The apparatus of example 14, wherein the circuit turns off a pull-up device and a pull-down device during an evaluation phase separate from the reset phase, wherein the pull-down device is to pull-down the voltage on the summing node, wherein the pull-up device is to pull-up the voltage on the summing node.

Example 18: A system comprising: a processor circuitry to execute one or more instructions; a memory coupled to the processor circuitry, the memory to store the one or more instructions; and a communication interface to allow the processor circuitry to communicate with another device, wherein the processor circuitry includes a configurable logic, wherein the configurable logic comprises: a first input; a second input; a summing node; a first capacitor having a first terminal coupled to the first input, and a second terminal coupled to the summing node, wherein the first capacitor includes a first ferroelectric material; a second capacitor having a third terminal coupled to the second input, and a fourth terminal coupled to the summing node, wherein the second capacitor includes a second ferroelectric material; a pull-up device coupled to the summing node and a power supply rail, wherein the pull-up device is controlled by a first control; and a pull-down device coupled to the summing node and a ground, wherein the pull-down device is controlled by a second control, wherein the first input, the second input, the first control, and the second control are set during a reset phase to adjust a threshold of the configurable logic.

Example 19: The system of example 18, wherein the first control and the second control turn off the pull-up device and the pull-down device during an evaluation phase separate from the reset phase.

Example 20: The system of example 18, wherein the first control and the second control are set sequentially in the reset phase.

Example 1a: An apparatus comprising: a first metal layer extending along an x-plane; a second metal layer extending along the x-plane, wherein the second metal layer is above the first metal layer; a first via extending along a y-plane, wherein the y-plane is orthogonal to the x-plane, wherein the first via couples the first metal layer with the second metal layer; a second via extending along the y-plane, wherein the second via couples the second metal layer, wherein the second via is above the first via; a first pedestal on the first metal layer, wherein the first pedestal is laterally offset from the first via; a second pedestal on the second metal layer, wherein the second pedestal is laterally offset from the second via; a summing node coupled to the first via; a first input line extending along a z-plane, wherein the z-plane is orthogonal to the x-plane and the y-plane; a second input line extending along the z-plane; a first planar stack of materials including a first ferroelectric dielectric material, wherein the first planar stack of materials has a top electrode and a bottom electrode, wherein the first ferroelectric dielectric material is between the top electrode and the bottom electrode, wherein the bottom electrode is on the first pedestal, wherein the first input line is on the top electrode; a second planar stack of materials including a second ferroelectric dielectric material, wherein the second planar stack of materials has a top electrode and a bottom electrode, wherein the second ferroelectric dielectric material is between the top electrode of the second planar stack of materials and the bottom electrode and the second planar stack of materials, wherein the bottom electrode is on the second pedestal, wherein the second input line on the top electrode of the second planar stack of materials; a pull-up device coupled to the summing node and a power supply rail; and a pull-down device coupled to the summing node and a ground.

Example 2a: The apparatus of example 1a, wherein the pull-up device is controlled by a first control, wherein the pull-down device is controlled by a second control, wherein voltages on the first input line, the second input line, the first control, and the second control are set in a first operation mode to adjust a threshold of the apparatus.

Example 3a: The apparatus of example 2a, wherein the first control is to cause the pull-up device to be off in a second operation mode, wherein the second control is to wherein the second operation mode occurs after the first operation mode.

Example 4a: The apparatus of example 1a, wherein the first ferroelectric dielectric material or the second ferroelectric dielectric material includes one of the ferroelectric materials discussed herein.

Example 5a: The apparatus of example 1a, wherein the top electrode and the bottom electrode of the first planar stack of materials includes one or more of: Cu, Al, Ag, Au, W, or Co.

Example 6a: The apparatus of example 1a, wherein capacitance of the first planar stack of materials is substantially equal to the capacitance of the second planar stack of materials.

Example 7a: The apparatus of example 1a, wherein capacitance of the first planar stack of materials is substantially different to the capacitance of the second planar stack of materials.

Example 8a: The apparatus of example 2a, wherein, in the first operation mode, the threshold of the apparatus is adjusted to 0 after the pull-down device is enabled first, and then the pull-down device is disabled, and then the pull-up device is enabled, and the first input line is set to logic 0 and the second input line is set to logic 0.

Example 9a: The apparatus of example 2a, wherein, in the first operation mode, the threshold of the apparatus is adjusted to 1 after the pull-down device is enabled first, and then the pull-down device is disabled, and then the pull-up device is enabled, and the first input line is set to logic 1 and the second input line is set to logic 0.

Example 10a: The apparatus of example 2, wherein, in the first operation mode, the threshold of the apparatus is adjusted to 1 after the pull-up device is enabled first, and then the pull-up device is disabled, and then the pull-down device is enabled, and the first input line is set to logic 0 and the second input line is set to logic 0.

Example 11a: The apparatus of example 2a, wherein, in the first operation mode, the threshold of the apparatus is adjusted to 2 after the pull-down device is enabled first, and then the pull-down device is disabled, and then the pull-up device is enabled, and the first input line is set to logic 1 and the second input line is set to logic 1.

Example 12a: The apparatus of example 2a, wherein, in the first operation mode, the threshold of the apparatus is adjusted to 2 after the pull-up device is enabled first, and then the pull-up device is disabled, and then the pull-down device is enabled, and the first input line is set to logic 1 and the second input line is set to logic 0.

Example 13a: The apparatus of example 2a, wherein, in the first operation mode, the threshold of the apparatus is adjusted to 3 after the pull-up device is enabled first, and then the pull-up device is disabled, and then the pull-down device is enabled, and the first input line is set to logic 1 and the second input line is set to logic 1.

Example 14a: An apparatus comprising: a first transistor, the first transistor having a first source region and a first drain region, and a first gate, wherein the first gate is controllable by a first control; a second transistor, the second transistor having a second source region and a second drain region, and a second gate, wherein the second gate is controllable by a second control; a first via is coupled to the first source region; a second via is coupled to the first drain region; a first metal layer over the first via, the first metal layer extending along an x-plane; a second etch stop layer over the first metal layer; a third via, over the first metal layer, and etched through the second etch stop layer, the third via in direct connection to the first metal layer; a second metal layer extending along the x-plane, wherein the second metal layer is above the first metal layer, wherein the second metal layer couples the third via; an interlayer dielectric between the first metal layer and the second metal layer; a first pedestal filled with metal, wherein the first pedestal is coupled to the second metal layer; a first plurality of layers to form a first planar capacitor, wherein the first plurality of layers includes a first ferroelectric dielectric material, wherein a first layer of the first plurality of layers is in contact with a top portion of the first pedestal, wherein a second layer of the first plurality of layers is coupled to a first input line; a fourth via in direct connection to the second metal layer; a third metal layer over the fourth via, wherein the first plurality of layers is between the second metal layer and the third metal layer; a second pedestal filled with metal, wherein the second pedestal is coupled to the third metal layer; and a second plurality of layers to form a second planar capacitor, wherein the second plurality of layers includes a second ferroelectric dielectric material, wherein a first layer of the second plurality of layers is in direct contact with a top portion of the second pedestal, wherein a second layer of the second plurality of layers is coupled to a second input line.

Example 15a: The apparatus of example 14a, wherein voltages on the first input line, the second input line, the first control, and the second control are set in a first operation mode to adjust a threshold of the apparatus.

Example 16a: The apparatus of example 15a, wherein the first control is to cause the first transistor to be off in a second operation mode, wherein the second control is to cause the second transistor to be off in a second operation mode, wherein the second operation mode occurs after the first operation mode.

Example 17a: The apparatus of example 15a, wherein the first drain region is coupled to ground, wherein the second drain region is coupled to a power supply rail.

Example 18a: The apparatus of example 15a, wherein the first transistor and the second transistor are turned on in a sequence in the first operation mode.

Example 19a: A system comprising: a memory to store one or more instructions; a processor circuitry to execute the one or more instructions; and a communication device to allow the processor circuitry to communicate with another device, wherein the processor circuitry includes a capacitive input circuit and a configuration circuit, wherein the capacitive input circuit comprises: a first metal layer extending along an x-plane; a second metal layer extending along the x-plane, wherein the second metal layer is above the first metal layer; a first via extending along a y-plane, wherein the y-plane is orthogonal to the x-plane, wherein the first via couples the first metal layer with the second metal layer; a second via extending along the y-plane, wherein the second via couples the second metal layer, wherein the second via is above the first via; a first pedestal on the first metal layer, wherein the first pedestal is laterally offset from the first via; a second pedestal on the second metal layer, wherein the second pedestal is laterally offset from the second via; a summing node coupled to the first via; a first input line extending along a z-plane, wherein the z-plane is orthogonal to the x-plane and the y-plane; a second input line extending along the z-plane; a first planar stack of materials including a first ferroelectric dielectric material, wherein the first planar stack of materials has a top electrode and a bottom electrode, wherein the first ferroelectric dielectric material is between the top electrode and the bottom electrode, wherein the bottom electrode is on the first pedestal, wherein the first input line is on the top electrode; a second planar stack of materials including a second ferroelectric dielectric material, wherein the second planar stack of materials has a top electrode and a bottom electrode, wherein the second ferroelectric dielectric material is between the top electrode of the second planar stack of materials and the bottom electrode and the second planar stack of materials, wherein the bottom electrode is on the second pedestal, wherein the second input line on the top electrode of the second planar stack of materials; a pull-up device coupled to the summing node and a power supply rail; and a pull-down device coupled to the summing node and a ground.

Example 20a: The system of example 19a, wherein the pull-up device is controlled by a first control, wherein the pull-down device is controlled by a second control, wherein voltages on the first input line, the second input line, the first control, and the second control are set in a first operation mode to adjust a threshold of the capacitive input circuit, wherein the first control is to cause the pull-up device to be off in a second operation mode, wherein the second control is to cause the pull-down device to be off in the second operation mode, wherein the second operation mode occurs after the first operation mode; wherein the configuration circuit is to configure a logic function of the capacitive input circuit by adjustment of the threshold of the capacitive input circuit.

Example 1b: An apparatus comprising: a via extending along a y-plane, wherein the y-plane is orthogonal to an x-plane, wherein the via couples to a first metal layer; a first capacitor including a first ferroelectric dielectric material, wherein the first capacitor includes an electrode coupled to the via, wherein the electrode is in a middle of the first capacitor; a second capacitor including a second ferroelectric dielectric material, wherein the electrode passes through a middle of the second capacitor; a first input line extending along the x-plane or a z-plane, wherein the z-plane is orthogonal to the x-plane and the y-plane, wherein the first input line is on an outer portion of the first capacitor; a second input line extending along the x-plane or the z-plane, wherein the second input line is on an output portion of the second capacitor; a first transistor coupled to the via and a supply rail; and a second transistor coupled to the via and a ground.

Example 2b: The apparatus of example 1b, wherein the first transistor is controlled by a first control, wherein the second transistor is controlled by a second control, wherein voltages on the first input line, the second input line, the first control, and the second control are set in a first operation mode to adjust a threshold of the apparatus.

Example 3b: The apparatus of example 2b, wherein the first control is to cause the first transistor to be off in a second operation mode, wherein the second control is to cause the second transistor to be off in the second operation mode, wherein the second operation mode occurs after the first operation mode.

Example 4b: The apparatus of example 1b, wherein the first capacitor includes: a first layer coupled to the electrode, wherein the first layer comprises metal; a second layer around the first layer, wherein the second layer comprises a first conductive oxide; a third layer comprising the first ferroelectric dielectric material, wherein the third layer is around the second layer; a fourth layer around the third layer, wherein the fourth layer comprises a second conductive oxide, wherein the fourth layer is around the third layer; and a fifth layer around the fourth layer, wherein the fifth layer comprises metal, wherein the first input line is adjacent to part of the fifth layer.

Example 5b: The apparatus of example 4b, wherein: the first layer has a first circumference; the second layer has a second circumference; the third layer has a third circumference; the fourth layer has a fourth circumference; and the fifth layer has a fifth circumference, wherein the fifth circumference is larger than the fourth circumference, wherein the fourth circumference is larger than the third circumference, wherein the third circumference is larger than the second circumference, wherein the second circumference is larger than the first circumference.

Example 6b: The apparatus of example 1b, wherein the first ferroelectric dielectric material or the second ferroelectric dielectric material includes one or more of the ferroelectric materials discussed herein.

Example 7b: The apparatus of example 1b, wherein the electrode includes one or more of: Cu, Al, Ag, Au, W, or Co.

Example 8b: The apparatus of example 1b, wherein capacitance of the first capacitor is substantially equal to the capacitance of the second capacitor.

Example 9b: The apparatus of example 1b, wherein capacitance of the first capacitor is substantially different to the capacitance of the second capacitor.

Example 10b: The apparatus of example 2b, wherein, in the first operation mode, the threshold of the apparatus is adjusted to 0 after the second transistor is enabled first, and then the second transistor is disabled, and then first transistor is enabled, and the first input line is set to logic 0 and the second input line is set to logic 0.

Example 11b: The apparatus of example 2b, wherein, in the first operation mode, the threshold of the apparatus is adjusted to 1 after the second transistor is enabled first, and then the second transistor is disabled, and then the first transistor is enabled, and the first input line is set to logic 1 and the second input line is set to logic 0.

Example 12b: The apparatus of example 2b, wherein, in the first operation mode, the threshold of the apparatus is adjusted to 1 after the first transistor is enabled first, and then the first transistor is disabled, and then the second transistor is enabled, and the first input line is set to logic 0 and the second input line is set to logic 0.

Example 13b: The apparatus of example 2b, wherein, in the first operation mode, the threshold of the apparatus is adjusted to 2 after the second transistor is enabled first, and then the second transistor is disabled, and then the first transistor is enabled, and the first input line is set to logic 1 and the second input line is set to logic 1.

Example 14b: The apparatus of example 2b, wherein, in the first operation mode, the threshold of the apparatus is adjusted to 2 after the first transistor is enabled first, and then the first transistor is disabled, and then the second transistor is enabled, and the first input line is set to logic 1 and the second input line is set to logic 0.

Example 15b: The apparatus of example 2b, wherein, in the first operation mode, the threshold of the apparatus is adjusted to 3 after the first transistor is enabled first, and then the first transistor is disabled, and then the second transistor is enabled, and the first input line is set to logic 1 and the second input line is set to logic 1.

Example 16b: An apparatus comprising: a first transistor, the first transistor having a first source region and a first drain region, and a first gate, wherein the first transistor is controllable by a first control via the first gate; a second transistor, the second transistor having a second source region and a second drain region, and a second gate, wherein the second transistor is controllable by a second control via the second gate; a first via coupled to the first source region and the second drain region; a second via coupled to the first drain region, wherein the second via is coupled to a first supply rail, wherein the second source region is coupled to a second supply rail; a first metal layer over the first via, the first metal layer extending along an x-plane; a third via over the first metal layer, the third via in direct connection to the first metal layer, wherein the third via extends along a y-plane, wherein the y-plane is orthogonal to an x-plane; a first non-planar stack of materials including a first ferroelectric dielectric material, wherein the first non-planar stack of materials includes an electrode coupled to the third via, wherein the electrode is in a middle of the first non-planar stack of materials; a second non-planar stack of materials including a second ferroelectric dielectric material, wherein the electrode passes through a middle of the second non-planar stack of materials; a first input line extending along the x-plane or a z-plane, wherein the z-plane is orthogonal to the x-plane and the y-plane, wherein the first input line is on a portion of the first non-planar stack of materials; and a second input line extending along the x-plane or the z-plane, wherein the second input line is on a portion of the second non-planar stack of materials.

Example 17b: The apparatus of example 16b, wherein voltages on the first input line, the second input line, the first control, and the second control are set in a first operation mode to adjust a threshold of the apparatus, wherein the first control is to cause the first transistor to be off in a second operation mode, wherein the second control is to cause the second transistor to be off in the second operation mode, wherein the second operation mode occurs after the first operation mode.

Example 18b: A system comprising: a memory to store one or more instructions; a processor circuitry to execute the one or more instructions; and a communication device to allow the processor circuitry to communicate with another device, wherein the processor circuitry includes a capacitive input circuit and a configuration circuit, wherein the capacitive input circuit comprises: a via extending along a y-plane, wherein the y-plane is orthogonal to an x-plane, wherein the via couples to a first metal layer; a first capacitor including a ferroelectric dielectric material, wherein the first capacitor includes an electrode coupled to the via, wherein the electrode is in a middle of the first capacitor; a second capacitor including a ferroelectric dielectric material, wherein the electrode passes through a middle of the second capacitor; a first input line extending along the x-plane or a z-plane, wherein the z-plane is orthogonal to the x-plane and the y-plane, wherein the first input line is on an outer portion of the first capacitor; a second input line extending along the x-plane or the z-plane, wherein the second input line is on an output portion of the second capacitor; a first transistor coupled to the via and a first supply rail; and a second transistor coupled to the via and a second supply rail.

Example 19b: The system of example 18b, wherein: the first transistor is controlled by a first control; the second transistor is controlled by a second control; and the configuration circuit is to configure voltages on the first input line, the second input line, the first control, and the second control during a first phase to adjust a threshold of the capacitive input circuit.

Example 20b: The system of example 18b, wherein the configuration circuit is to adaptively configure a logic function of the capacitive input circuit by adjustment of a threshold of the capacitive input circuit.

Example 1c: A method comprising: during a reset phase, adjusting a threshold of a configurable logic gate by controlling a first input, a second input, a first control, and a second control, wherein the first input is coupled to a first terminal of a first capacitor, wherein a second terminal of the first capacitor is coupled to a summing node, wherein the second input is coupled to a third terminal of a second capacitor, wherein a fourth terminal of the second capacitor is coupled to the summing node, wherein the first control is coupled to a gate of a pull-up device, wherein the pull-up device is coupled to the summing node and a power supply rail, wherein the second control is coupled to a gate of a pull-down device, wherein the pull-down device is coupled to the summing node and a ground, wherein the first capacitor includes a first ferroelectric material, and wherein the second capacitor includes a second ferroelectric material; and during an evaluation phase after the reset phase: turning off the pull-up device; turning off the pull-down device; and evaluating an output of the configurable logic gate according to logic values on the first input and the second input.

Example 2c: The method of example 1c comprising configuring a logic function of the configurable logic gate by adjusting the threshold.

Example 3c: The method of example 1c comprising adjusting, in the reset phase, the threshold of the configurable logic gate to 0 by: turning on the pull-down device; turning off the pull-down device after turning on the pull-down device; turning on the pull-up device after turning off the pull-down device; setting the first input to logic 0; and setting the second input to logic 0.

Example 4c: The method of example 1c comprising adjusting, in the reset phase, the threshold of the configurable logic gate to 1 by: turning on the pull-down device; turning off the pull-down device after turning on the pull-down device; turning on the pull-up device after turning off the pull-down device; setting the first input to logic 1; and setting the second input to logic 0.

Example 5c: The method of example 1c comprising adjusting, in the reset phase, the threshold of the configurable logic gate to 1 by: turning on the pull-up device; turning off the pull-up device after turning on the pull-up device; turning on the pull-down device after turning off the pull-up device; setting the first input to logic 0; and setting the second input to logic 0.

Example 6c: The method of example 1c comprising adjusting, in the reset phase, the threshold of the configurable logic gate to 2 by: turning on the pull-down device; turning off the pull-down device after turning on the pull-down device; turning on the pull-up device after turning off the pull-down device; setting the first input to logic 1; and setting the second input to logic 1.

Example 7c: The method of example 1c comprising adjusting, in the reset phase, the threshold of the configurable logic gate to 2 by: turning on the pull-up device; turning off the pull-up device after turning on the pull-up device; turning on the pull-down device after turning on the pull-up device; setting the first input to logic 1; and setting the second input to logic 0.

Example 8c: The method of example 1c comprising adjusting, in the reset phase, the threshold of the configurable logic gate to 3 by: turning on the pull-up device; turning off the pull-up device after turning on the pull-up device; turning on the pull-down device after turning off the pull-up device; setting the first input to logic 1; and setting the second input to logic 1.

Example 9c: The method of example 1c, wherein the first ferroelectric material is between a top electrode and a bottom electrode, wherein the top electrode or the bottom electrode include one or more of: Cu, Al, Ag, Au, W, or Co.

Example 10c: The method of example 1c, wherein the first ferroelectric material or the second ferroelectric material includes one or more of the ferroelectric materials discussed herein.

Example 11c: The method of example 1c, wherein capacitance of the first capacitor is substantially equal to the capacitance of the second capacitor.

Example 12c: The method of example 1c, wherein capacitance of the first capacitor is substantially different to the capacitance of the second capacitor.

Example 13c: The method of example 1c, wherein adjusting the threshold comprises: sequentially turning on the pull-up device and the pull-down device during the reset phase.

Example 14c: A method comprising: during a reset phase, sequentially turning on a pull-up device and a pull-down device, wherein the pull-up device and the pull-down device are coupled to a summing node, wherein a first input is coupled to a first terminal of a first capacitor, wherein a second terminal of the first capacitor is coupled to the summing node, wherein a second input is coupled to a third terminal of a second capacitor, wherein a fourth terminal of the second capacitor is coupled to the summing node, wherein the first capacitor comprises a first ferroelectric material, wherein the second capacitor comprises a second ferroelectric material, wherein the pull-up device, the pull-down device, the first capacitor, and the second capacitor are part of a capacitive input circuit; applying the first input and the second input to the first capacitor and the second capacitor during the reset phase; and during an evaluation phase, turning off the pull-up device and the pull-down device.

Example 15c: The method of example 14c comprises generating a logic function based on a threshold of the capacitive input circuit, wherein the threshold is adjusted during the reset phase.

Example 16c: The method of example 15c comprising adjusting, in the reset phase, the threshold of the capacitive input circuit to 0 by: turning on the pull-down device; turning off the pull-down device after turning on the pull-down device; turning on the pull-up device after turning off the pull-down device; setting the first input to logic 0; and setting the second input to logic 0.

Example 17c: The method of example 15c comprising adjusting, in the reset phase, the threshold of the capacitive input circuit to 1 by: turning on the pull-down device; turning off the pull-down device after tuning on the pull-down device; turning on the pull-up device after turning off the pull-down device; setting the first input to logic 1; and setting the second input to logic 0.

Example 18c: The method of example 15c comprising adjusting, in the reset phase, the threshold of the capacitive input circuit to 2 by: turning on the pull-down device; turning off the pull-down device after turning on the pull-down device; turning on the pull-up device after turning off the pull-down device; setting the first input to logic 1; and setting the second input to logic 1.

Example 19c: A method comprising: during a reset phase, adjusting a threshold of a configurable logic gate by controlling a first input, a second input, a first control, and a second control, wherein the first input is coupled to a first terminal of a first capacitor, wherein a second terminal of the first capacitor is coupled to a summing node, wherein the second input is coupled to a third terminal of a second capacitor, wherein a fourth terminal of the second capacitor is coupled to the summing node, wherein the first control is coupled to a first gate of a first transistor which is coupled to the summing node and a supply rail, wherein the second control is coupled to a second gate of a second transistor which is coupled to the summing node and a supply rail, wherein the first capacitor includes a first ferroelectric material, wherein the second capacitor includes a second ferroelectric material; and during an evaluation phase after the reset phase, controlling the first transistor and the second transistor and evaluating an output of the configurable logic gate according to logic values on the first input and the second input.

Example 20c: The method of example 19c comprising configuring a logic function of the configurable logic gate by adjusting the threshold.

Example 1d: A machine-readable storage media (e.g., a memory) including machine executable instructions (e.g., software or firmware instructions) that, when executed, cause one or more machines (e.g., processors) to perform a method according to any one of examples 1c to 13c, 14c to 18c, 19c to 20c, or any of the method discussed herein.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first metal layer that extends along an x-plane;
   a second metal layer that extends along the x-plane, wherein the second metal layer is above the first metal layer;
   a first via that extends along a y-plane, wherein the y-plane is orthogonal to the x-plane, and wherein the first via couples the first metal layer with the second metal layer;
   a second via that extends along the y-plane, wherein the second via couples the second metal layer, and wherein the second via is above the first via;
   a first pedestal on the first metal layer, wherein the first pedestal is laterally offset from the first via;
   a second pedestal on the second metal layer, wherein the second pedestal is laterally offset from the second via;
   a summing node coupled to the first via;
   a first input line that extends along a z-plane, wherein the z-plane is orthogonal to the x-plane and the y-plane;
   a second input line that extends along the z-plane;
   a first planar stack of materials including a first ferroelectric dielectric material, wherein the first planar stack of materials has a top electrode and a bottom electrode, wherein the first ferroelectric dielectric material is between the top electrode and the bottom electrode, wherein the bottom electrode is on the first pedestal, and wherein the first input line is on the top electrode;
   a second planar stack of materials including a second ferroelectric dielectric material, wherein the second planar stack of materials has a top electrode and a bottom electrode, wherein the second ferroelectric dielectric material is between the top electrode of the second planar stack of materials and the bottom electrode and the second planar stack of materials, wherein the bottom electrode is on the second pedestal, and wherein the second input line on the top electrode of the second planar stack of materials;
   a pull-up device coupled to the summing node and a power supply rail; and
   a pull-down device coupled to the summing node and a ground.

2. The apparatus of claim 1, wherein the pull-up device is controlled by a first control, wherein the pull-down device is controlled by a second control, and wherein voltages on the first input line, the second input line, the first control, and the second control are set in a first operation mode to adjust a threshold of the apparatus.

3. The apparatus of claim 2, wherein the first control is to cause the pull-up device to be off in a second operation mode, and wherein the second control is to wherein the second operation mode occurs after the first operation mode.

4. The apparatus of claim 2, wherein, in the first operation mode, the threshold of the apparatus is adjusted to 0 after the pull-down device is enabled first, and then the pull-down device is disabled, and then the pull-up device is enabled, and the first input line is set to logic 0 and the second input line is set to logic 0.

5. The apparatus of claim 2, wherein, in the first operation mode, the threshold of the apparatus is adjusted to 1 after the pull-down device is enabled first, and then the pull-down device is disabled, and then the pull-up device is enabled, and the first input line is set to logic 1 and the second input line is set to logic 0.

6. The apparatus of claim 2, wherein, in the first operation mode, the threshold of the apparatus is adjusted to 1 after the pull-up device is enabled first, and then the pull-up device is disabled, and then the pull-down device is enabled, and the first input line is set to logic 0 and the second input line is set to logic 0.

7. The apparatus of claim 2, wherein, in the first operation mode, the threshold of the apparatus is adjusted to 2 after the pull-down device is enabled first, and then the pull-down device is disabled, and then the pull-up device is enabled, and the first input line is set to logic 1 and the second input line is set to logic 1.

8. The apparatus of claim 2, wherein, in the first operation mode, the threshold of the apparatus is adjusted to 2 after the pull-up device is enabled first, and then the pull-up device is disabled, and then the pull-down device is enabled, and the first input line is set to logic 1 and the second input line is set to logic 0.

9. The apparatus of claim 2, wherein, in the first operation mode, the threshold of the apparatus is adjusted to 3 after the pull-up device is enabled first, and then the pull-up device is disabled, and then the pull-down device is enabled, and the first input line is set to logic 1 and the second input line is set to logic 1.

10. The apparatus of claim 1, wherein the first ferroelectric dielectric material or the second ferroelectric dielectric material includes one of:
    Bismuth ferrite (BFO) with a first doping material, wherein the first doping material is one of Lanthanum or elements from lanthanide series of periodic table;
    Lead zirconium titanate (PZT) or PZT with a second doping material, wherein the second doping material is one of La or Nb;
    a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
    a perovskite which includes one of: BaTiO3, PbTiO3, KNbO3, or NaTaO3;
    a hexagonal ferroelectric which includes one of: YMnO3 or LuFeO3;
    hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
    Hafnium (Hf), Zirconium (Zr), Aluminum (Al), Silicon (Si), their oxides or their alloyed oxides;
    Hafnium oxides as Hf1-x Ex Oy, where E can be Al, Ca, Ce, Dy, Er, Gd, Ge, La, Sc, Si, Sr, Sn, or Y;

Al(1-x)Sc(x)N, Ga(1-x)Sc(x)N, Al(1-x)Y(x)N or Al(1-x-y)Mg(x)Nb(y)N, y doped HfO2, where 'y' includes one of: Al, Ca, Ce, Dy, Er, Gd, Ge, La, Sc, Si, Sr, Sn, or Y, wherein 'x' is a fraction;

Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100.

11. The apparatus of claim 1, wherein the top electrode and the bottom electrode of the first planar stack of materials includes one or more of: Cu, Al, Ag, Au, W, or Co.

12. The apparatus of claim 1, wherein capacitance of the first planar stack of materials is substantially equal to the capacitance of the second planar stack of materials.

13. The apparatus of claim 1, wherein capacitance of the first planar stack of materials is substantially different to the capacitance of the second planar stack of materials.

14. An apparatus comprising:
a first transistor, the first transistor having a first source region and a first drain region, and a first gate, wherein the first gate is controllable by a first control;
a second transistor, the second transistor having a second source region and a second drain region, and a second gate, wherein the second gate is controllable by a second control;
a first via is coupled to the first source region;
a second via is coupled to the first drain region;
a first metal layer over the first via, the first metal layer that extends along an x-plane;
a second etch stop layer over the first metal layer;
a third via, over the first metal layer, and etched through the second etch stop layer, the third via in direct connection to the first metal layer;
a second metal layer that extends along the x-plane, wherein the second metal layer is above the first metal layer, and wherein the second metal layer couples the third via;
an interlayer dielectric between the first metal layer and the second metal layer;
a first pedestal filled with metal, wherein the first pedestal is coupled to the second metal layer;
a first plurality of layers to form a first planar capacitor, wherein the first plurality of layers includes a first ferroelectric dielectric material, wherein a first layer of the first plurality of layers is in contact with a top portion of the first pedestal, and wherein a second layer of the first plurality of layers is coupled to a first input line;
a fourth via in direct connection to the second metal layer;
a third metal layer over the fourth via, wherein the first plurality of layers is between the second metal layer and the third metal layer;
a second pedestal filled with metal, wherein the second pedestal is coupled to the third metal layer; and
a second plurality of layers to form a second planar capacitor, wherein the second plurality of layers includes a second ferroelectric dielectric material, wherein a first layer of the second plurality of layers is in direct contact with a top portion of the second pedestal, and wherein a second layer of the second plurality of layers is coupled to a second input line.

15. The apparatus of claim 14, wherein voltages on the first input line, the second input line, the first control, and the second control are set in a first operation mode to adjust a threshold of the apparatus.

16. The apparatus of claim 15, wherein the first control is to cause the first transistor to be off in a second operation mode, wherein the second control is to cause the second transistor to be off in a second operation mode, and wherein the second operation mode occurs after the first operation mode.

17. The apparatus of claim 15, wherein the first drain region is coupled to ground, and wherein the second drain region is coupled to a power supply rail.

18. The apparatus of claim 15, wherein the first transistor and the second transistor are turned on in a sequence in the first operation mode.

19. A system comprising:
a memory to store one or more instructions;
a processor circuitry to execute the one or more instructions; and
a communication device to allow the processor circuitry to communicate with another device, wherein the processor circuitry includes a capacitive input circuit and a configuration circuit, and wherein the capacitive input circuit comprises:
a first metal layer that extends along an x-plane;
a second metal layer that extends along the x-plane, wherein the second metal layer is above the first metal layer;
a first via that extends along a y-plane, wherein the y-plane is orthogonal to the x-plane, and wherein the first via couples the first metal layer with the second metal layer;
a second via that extends along the y-plane, wherein the second via couples the second metal layer, wherein the second via is above the first via;
a first pedestal on the first metal layer, wherein the first pedestal is laterally offset from the first via;
a second pedestal on the second metal layer, wherein the second pedestal is laterally offset from the second via;
a summing node coupled to the first via;
a first input line that extends along a z-plane, wherein the z-plane is orthogonal to the x-plane and the y-plane;
a second input line that extends along the z-plane;
a first planar stack of materials including a first ferroelectric dielectric material, wherein the first planar stack of materials has a top electrode and a bottom electrode, wherein the first ferroelectric dielectric material is between the top electrode and the bottom electrode, wherein the bottom electrode is on the first pedestal, and wherein the first input line is on the top electrode;
a second planar stack of materials including a second ferroelectric dielectric material, wherein the second planar stack of materials has a top electrode and a bottom electrode, wherein the second ferroelectric dielectric material is between the top electrode of the second planar stack of materials and the bottom electrode and the second planar stack of materials, wherein the bottom electrode is on the second pedestal, and wherein the second input line on the top electrode of the second planar stack of materials;
a pull-up device coupled to the summing node and a power supply rail; and
a pull-down device coupled to the summing node and a ground.

20. The system of claim 19, wherein the pull-up device is controlled by a first control, wherein the pull-down device is controlled by a second control, wherein voltages on the first input line, the second input line, the first control, and the second control are set in a first operation mode to adjust a threshold of the capacitive input circuit, wherein the first control is to cause the pull-up device to be off in a second operation mode, wherein the second control is to cause the pull-down device to be off in the second operation mode, wherein the second operation mode occurs after the first operation mode and wherein the configuration circuit is to configure a logic function of the capacitive input circuit by adjustment of the threshold of the capacitive input circuit.

* * * * *